US009685579B2

(12) United States Patent
Gonzalez et al.

(10) Patent No.: US 9,685,579 B2
(45) Date of Patent: Jun. 20, 2017

(54) PHOTOVOLTAIC STRUCTURE CLEAVING SYSTEM

(71) Applicant: SolarCity Corporation, San Mateo, CA (US)

(72) Inventors: Pablo Gonzalez, Fremont, CA (US); Bobby Yang, Los Altos Hills, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/826,129

(22) Filed: Aug. 13, 2015

(65) Prior Publication Data

US 2016/0163907 A1 Jun. 9, 2016

Related U.S. Application Data

(60) Provisional application No. 62/088,509, filed on Dec. 5, 2014, provisional application No. 62/143,694, filed on Apr. 6, 2015.

(51) Int. Cl.
*B32B 38/10* (2006.01)
*H01L 31/18* (2006.01)
(Continued)

(52) U.S. Cl.
CPC ............ *H01L 31/18* (2013.01); *B28D 5/0052* (2013.01); *B28D 5/0094* (2013.01); *B32B 38/10* (2013.01); *B32B 43/006* (2013.01); *H01L 21/3043* (2013.01); *H01L 21/683* (2013.01); *H01L 21/6838* (2013.01); *H01L 21/68735* (2013.01);
(Continued)

(58) Field of Classification Search
CPC ... B32B 38/10; B32B 43/006; H01L 21/3043; Y10T 156/1179; Y10T 156/1184; Y10T 156/1967; Y10T 156/1983
USPC .......... 156/716, 717, 750, 761, 762; 83/422, 83/875, 879
See application file for complete search history.

(56) References Cited

U.S. PATENT DOCUMENTS 2,938,938 A 5/1960 Dickson, Jr.
3,116,171 A 12/1963 Nielsen et al.
(Continued)

FOREIGN PATENT DOCUMENTS

CN 104276750 A 1/2015
DE 4030713 A1 4/1992
(Continued)

OTHER PUBLICATIONS

International Search Report mailed on Mar. 24, 2016 for International Patent Application No. PCT/US2015/064060, 6 pages.
(Continued)

*Primary Examiner* — Mark A Osele
*Assistant Examiner* — Nickolas Harm
(74) *Attorney, Agent, or Firm* — Kilpatrick Townsend & Stockton LLP

(57) ABSTRACT

A cleaving system is described. The system can include a holding apparatus to retain a photovoltaic structure at a center section of a cleaving platform. The system can further include a contact apparatus to make contact with the photovoltaic structure and separate it into a plurality of strips. During operation, the system can activate an actuator to move the contact apparatus against the photovoltaic structure, thereby separating the photovoltaic structure into strips.

13 Claims, 25 Drawing Sheets

(51) Int. Cl.
*B28D 5/00* (2006.01)
*H01L 21/304* (2006.01)
*H01L 21/683* (2006.01)
*B32B 43/00* (2006.01)
*H01L 21/687* (2006.01)

(52) U.S. Cl.
CPC ... *H01L 21/68778* (2013.01); *Y10T 156/1179* (2015.01); *Y10T 156/1184* (2015.01); *Y10T 156/1967* (2015.01); *Y10T 156/1983* (2015.01)

(56) References Cited

U.S. PATENT DOCUMENTS

| | | | |
|---|---|---|---|
| 3,459,597 A | | 8/1969 | Baron |
| 4,049,167 A | | 9/1977 | Guissard |
| 4,428,518 A | * | 1/1984 | Abel .................... C03B 33/033 225/103 |
| 4,577,051 A | | 3/1986 | Hartmann |
| 4,652,693 A | | 3/1987 | Bar-On |
| 4,877,460 A | | 10/1989 | Flödl |
| 5,069,195 A | | 12/1991 | Barozzi |
| 5,118,361 A | | 6/1992 | Fraas et al. |
| 5,178,685 A | | 1/1993 | Borenstein et al. |
| 6,017,804 A | | 1/2000 | Freund et al. |
| 6,171,933 B1 | | 1/2001 | Xu et al. |
| 6,232,545 B1 | | 5/2001 | Samaras et al. |
| 6,303,853 B1 | | 10/2001 | Fraas et al. |
| 6,441,297 B1 | | 8/2002 | Keller et al. |
| 6,538,193 B1 | | 3/2003 | Fraas |
| 6,620,645 B2 | | 9/2003 | Chandra et al. |
| 6,803,513 B2 | | 10/2004 | Beernink et al. |
| 7,328,534 B2 | | 2/2008 | Dinwoodie |
| 7,388,146 B2 | | 6/2008 | Fraas et al. |
| 7,635,810 B2 | | 12/2009 | Luch |
| 7,749,883 B2 | | 7/2010 | Meeus et al. |
| 7,772,484 B2 | | 8/2010 | Li et al. |
| 7,777,128 B2 | | 8/2010 | Montello et al. |
| 7,825,329 B2 | | 11/2010 | Basol |
| 7,829,781 B2 | | 11/2010 | Montello et al. |
| 7,829,785 B2 | | 11/2010 | Basol |
| 7,872,192 B1 | | 1/2011 | Fraas et al. |
| 7,872,193 B2 | | 1/2011 | Ogawa et al. |
| 8,034,653 B2 | | 10/2011 | Kannou |
| 8,168,880 B2 | | 5/2012 | Jacobs |
| 8,209,920 B2 | | 7/2012 | Krause et al. |
| 8,220,685 B1 | | 7/2012 | Linsdey, Jr. et al. |
| 8,222,513 B2 | | 7/2012 | Luch |
| 8,343,795 B2 | | 1/2013 | Luo et al. |
| 8,513,095 B1 | | 8/2013 | Funcell et al. |
| 8,586,857 B2 | | 11/2013 | Everson et al. |
| 2003/0000571 A1 | | 1/2003 | Wakuda et al. |
| 2003/0201007 A1 | | 10/2003 | Fraas et al. |
| 2005/0257823 A1 | | 11/2005 | Zwanenburg |
| 2007/0283997 A1 | | 12/2007 | Hachtmann et al. |
| 2008/0213979 A1 | | 9/2008 | Kannou |
| 2010/0043863 A1 | | 2/2010 | Wudu et al. |
| 2010/0147364 A1 | | 6/2010 | Gonzalez et al. |
| 2010/0193014 A1 | | 8/2010 | Johnson et al. |
| 2010/0218799 A1 | | 9/2010 | Stefani |
| 2010/0224230 A1 | | 9/2010 | Luch et al. |
| 2011/0156188 A1 | | 6/2011 | Tu et al. |
| 2011/0259419 A1 | | 10/2011 | Hagemann et al. |
| 2012/0000502 A1 | | 1/2012 | Wiedeman et al. |
| 2012/0040487 A1 | | 2/2012 | Asthana et al. |
| 2012/0060911 A1 | | 3/2012 | Fu et al. |
| 2012/0125391 A1 | | 5/2012 | Pinarbasi et al. |
| 2012/0152349 A1 | | 6/2012 | Cao et al. |
| 2012/0240995 A1 | | 9/2012 | Coakley |
| 2012/0248497 A1 | | 10/2012 | Zhou et al. |
| 2012/0279548 A1 | | 11/2012 | Münch et al. |
| 2012/0318319 A1 | | 12/2012 | Pinarbasi et al. |
| 2012/0318340 A1 | | 12/2012 | Heng et al. |
| 2012/0325282 A1 | | 12/2012 | Snow et al. |
| 2013/0096710 A1 | | 4/2013 | Pinarbasi et al. |
| 2013/0126576 A1 | | 5/2013 | Marshall et al. |
| 2013/0152996 A1 | | 6/2013 | DeGroot et al. |
| 2013/0206221 A1 | | 8/2013 | Gannon et al. |
| 2014/0124013 A1 | | 5/2014 | Morad et al. |
| 2014/0124014 A1 | | 5/2014 | Morad et al. |
| 2014/0138421 A1 | | 5/2014 | Gagnon et al. |
| 2015/0090314 A1 | | 4/2015 | Yang et al. |
| 2015/0349145 A1 | | 12/2015 | Morad et al. |
| 2015/0349153 A1 | | 12/2015 | Morad et al. |
| 2015/0349161 A1 | | 12/2015 | Morad et al. |
| 2015/0349162 A1 | | 12/2015 | Morad et al. |
| 2015/0349167 A1 | | 12/2015 | Morad et al. |
| 2015/0349168 A1 | | 12/2015 | Morad et al. |
| 2015/0349169 A1 | | 12/2015 | Morad et al. |
| 2015/0349170 A1 | | 12/2015 | Morad et al. |
| 2015/0349171 A1 | | 12/2015 | Morad et al. |
| 2015/0349172 A1 | | 12/2015 | Morad et al. |
| 2015/0349173 A1 | | 12/2015 | Morad et al. |
| 2015/0349174 A1 | | 12/2015 | Morad et al. |
| 2015/0349175 A1 | | 12/2015 | Morad et al. |
| 2015/0349176 A1 | | 12/2015 | Morad et al. |
| 2015/0349190 A1 | | 12/2015 | Morad et al. |
| 2015/0349193 A1 | | 12/2015 | Morad et al. |
| 2015/0349701 A1 | | 12/2015 | Morad et al. |
| 2015/0349702 A1 | | 12/2015 | Morad et al. |
| 2015/0349703 A1 | | 12/2015 | Morad et al. |

FOREIGN PATENT DOCUMENTS

| | | |
|---|---|---|
| EP | 2362430 A1 | 8/2011 |
| JP | S59 117235 A | 7/1984 |
| JP | H09 19918 A | 1/1997 |
| JP | H11 79770 A | 3/1999 |
| JP | H11 192616 A | 7/1999 |
| JP | 2010 128407 A | 6/2010 |
| JP | 2011 026136 A | 2/2011 |
| JP | 2012-256738 A | 12/2012 |
| WO | 2008089657 A1 | 7/2008 |
| WO | 2013020590 A1 | 2/2013 |
| WO | 2013/175535 A1 | 11/2013 |
| WO | 2014074826 A2 | 5/2014 |

OTHER PUBLICATIONS

Written Opinion mailed on Mar. 24, 2016 for International Patent Application No. PCT/US2015/064060, 6 pages.

Unpublished U.S. Appl. No. 14/510,008, filed Oct. 8, 2014, by Jiunn Benjamin Heng et al. (54 pages).

* cited by examiner

PHOTOVOLTAIC STRUCTURE CLEAVING SYSTEM

CROSS-REFERENCE TO OTHER APPLICATIONS

This claims the benefit of U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015, the disclosures of which are incorporated herein by reference in their entirety for all purposes.

This is related to U.S. patent application Ser. No. 14/563,867, entitled "HIGH EFFICIENCY SOLAR PANEL" filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014, the disclosures of which are incorporated herein by reference in its entirety for all purposes.

FIELD OF THE INVENTION

This is generally related to solar panel fabrication, including cleaving a photovoltaic structure into multiple strips.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014 and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

One method of making such a panel includes sequentially connecting the busbars of adjacent cells and combining them. One type of panel (as described in the above-noted patent application) includes a series of cascaded strips created by dividing complete solar cells into strips, and then cascading the strips to form one or more strings.

Precise and consistent division of solar cells into strips and alignment of strips or cells when forming a cascade arrangement is critical to ensure proper electrical and physical connections, but such alignment can be difficult to achieved reliably in high volumes if performed manually.

SUMMARY

One embodiment of the invention provides an apparatus for separating a photovoltaic structure into a number of strips. In one embodiment, the apparatus can include a first surface and a second surface. The two surfaces are connected and not parallel to each other. Optionally the surfaces are flat and can form a non-180-degree angle. A junction between the first surface and second surface can form a first fulcrum edge, which facilitates the photovoltaic structure to be held on the first surface and separated along the first fulcrum edge.

In a variation of this embodiment, the first surface may include a holding mechanism to hold the photovoltaic structure to the first surface.

In a further variation, the holding mechanism can include at least one device adapted to hold the photovoltaic structure by creating a pressure difference.

In a variation of this embodiment, the apparatus can include a cleaving head having a plurality of contact points adapted to push on an area on the photovoltaic structure that is not supported by the first surface.

In a variation of this embodiment, the second surface can include a buffer mechanism to reduce impact when the photovoltaic lands on the second surface.

In a further variation, the buffer mechanism can include at least one device adapted to slow down the photovoltaic structure's movement after being separated by creating an air flow ejected from the second surface against the photovoltaic structure.

In a variation of this embodiment, the apparatus can include an edge connected to the second surface to guide a strip of the photovoltaic structure after being separated to fall into a predetermined position.

In a variation of this embodiment, the apparatus can further include a third surface connected to the first surface, while being non-parallel to it. Optionally the third and first surfaces can form a non-180-degree angle with the first surface. The junction between the first surface and third surface can form a second fulcrum edge, thereby facilitating the photovoltaic structure to be separated into three strips.

One embodiment of the present invention provides a system for cleaving a photovoltaic structure. During operation, the system can activate a holding apparatus to retain the photovoltaic structure near the center section of a cleaving platform. The system can further activate an actuator to cause a contact apparatus to contact the photovoltaic structure and separate the photovoltaic structure into a plurality of strips along at least one fulcrum edge on the cleaving platform.

In a variation of this embodiment, while activating the actuator, the system can move, such as lower, the contact apparatus to make contact with the photovoltaic structure.

In a variation of this embodiment, while activating the actuator, the system can conform the holding apparatus to cause a top surface of the photovoltaic structure to make contact with the contact apparatus.

In a variation of this embodiment, the contact apparatus can include a plurality of cleave tips, at least two of which can be arranged at different distances from a base of the contact apparatus. In addition, while activating the actuator, the system can cause the cleave tips to contact the photovoltaic structure sequentially.

In a variation of this embodiment, a side section of the cleaving platform can be sloped from the center section. The side section of the cleaving platform can include a plurality of air-emitting jets. In addition, the system can eject air via the jets to slow down the movement of a photovoltaic strip.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

A cleaving system is provided that automatically divides a photovoltaic structure into multiple strips without significantly damaging the individual strips. The cleaving system can operate within an automated assembly line that can manufacture complete solar panels, which may include photovoltaic structure strips arranged in a cascaded configuration.

The cleaving system can receive a photovoltaic structure that has been scribed along a blank space next to or near a busbar of the photovoltaic structure. The groove may be any orientation with respect to the busbar, but is normally substantially parallel to it. The cleaving system can divide the photovoltaic structure into two or more strips by breaking the photovoltaic structure along at least one scribed groove. For example, the cleaving system can include a row of cleave tips that may push down on an outer region of the photovoltaic structure, starting from one edge of the photovoltaic structure to cause the break to begin on that edge.

Later stages of the solar-panel assembly line may arrange a plurality of strips into one or more cascaded strings, and may then combine multiple strings to form a solar panel.

Figure 1A:
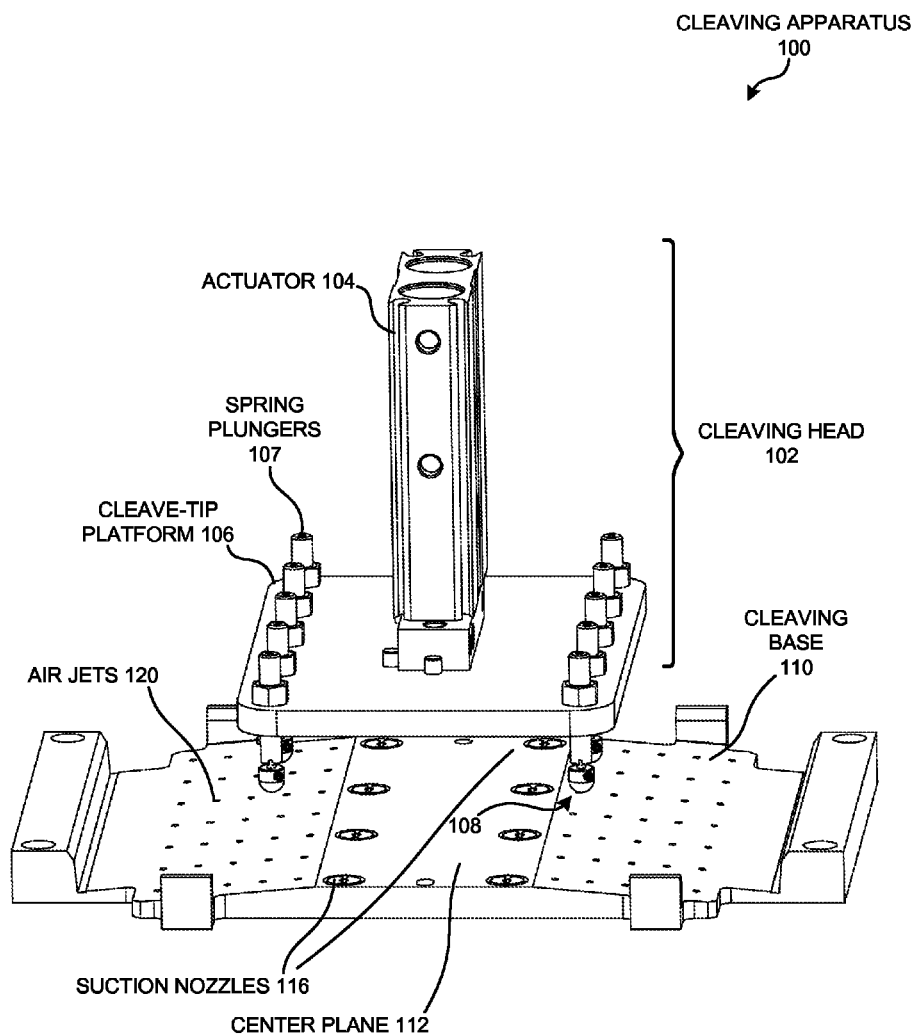
FIG. 1A shows a cleaving system according to one embodiment of the invention.

FIG. 1A shows cleaving system 100, according to one embodiment of the invention. During operation, cleaving system 100 can receive a photovoltaic structure which may have two (or other number of) grooves scribed on its upward-facing surface. Cleaving system 100 can secure at least one portion of the photovoltaic structure, while gently dividing the photovoltaic structure along the scribed grooves into multiple strips, without damaging the individual strips. For example, cleaving base 110 can include a set of suction nozzles 116 on center plane 112. Suction nozzles 116 may create a suction force underneath the photovoltaic structure to hold it down, while cleaving head 102 can cause the photovoltaic structure to divide into multiple strips along the scribed grooves. By holding down the photovoltaic structure using the suction force, cleaving base 110 can hold it down without having to clamp it down, which could otherwise fracture or scratch the photovoltaic structure.

To separate the photovoltaic structure, cleaving head 102 can apply a gentle downward force against a portion of the photovoltaic structure not being held down by center plane 112. Because the groove penetrates only a portion of the photovoltaic structure, the applied downward force can cause a clean cleaved interface along the scribed grooves. For example, actuator 104 can lower cleave-tip platform 106 onto the upward-facing surface of the photovoltaic structure to cause cleave tips 108 to press against two outer portions of the photovoltaic structure, while suction nozzles 116 create the suction force that holds down the center portion. The downward force from cleave tips 108 can cause the outer portions to break away into strips that may land on sloped surfaces on the sides of cleaving base 110, while a center strip may remain on center plane 112.

A hard landing onto cleaving base 110, however, might cause damage to a base-layer-to-emitter interface of the cleaved strips. To soften their landing, cleaving base 110 can include a set of air jets 120 underneath the strips that are not being held down by center plane 112. Air jets 120 can eject air in an upward direction while cleaving system 100 cleaves the photovoltaic structure into multiple strips. The air streams, which may be directed upwardly, can effectively counteract some of the downward gravitational force on the cleaved strips, and can soften their landing as they fall onto cleaving base 110 after breaking break away from the center strip.

The preferred or predetermined depth of the scribed grooves can vary, depending on physical constraints such as the thickness, the intrinsic material properties, and the temperature, etc., of the photovoltaic structure. In general, the groove can be scribed on either side of the photovoltaic structure. In one embodiment, to reduce the likelihood of damage to the interface between the base layer and the emitter layer (i.e., the interface between two semiconductor regions of opposite doping types, also referred to as the "emitter junction"), the groove can be scribed on a side that is opposite to such interface. Such damage could occur from high temperature if a laser scribing tool is used, or from mechanical forces if other scribing methods are used. In this case, the groove can penetrate, on the side where the surface field layer is located, a transparent conductive oxide (TCO) layer, a heavily doped surface field layer, an optional intrinsic tunneling layer, and a portion of a crystalline Si base layer. The groove depth can be sufficiently large to facilitate precise mechanical cleaving without the laser beam (if laser is used for scribing) reaching the base-layer-to-emitter-layer interface to cause any damage to this interface. As a result, the cleaving action can take place on the side where the groove is. That is, the photovoltaic structure can be held down on the side where the emitter layer is located (i.e., the layer that has a doping type opposite to that of the base layer), and cleaving head can push down on the side where the surface field layer is located.

The examples described herein are based on the assumption that a photovoltaic structure is cleaved into three strips. Embodiments of the invention, however, are not limited to such a configuration, and can be applied to other cleaving configurations. For example, embodiments of the invention can be used to cleave a photovoltaic structure into two, four, five, six, or more strips in a number of steps.

Figure 1B:
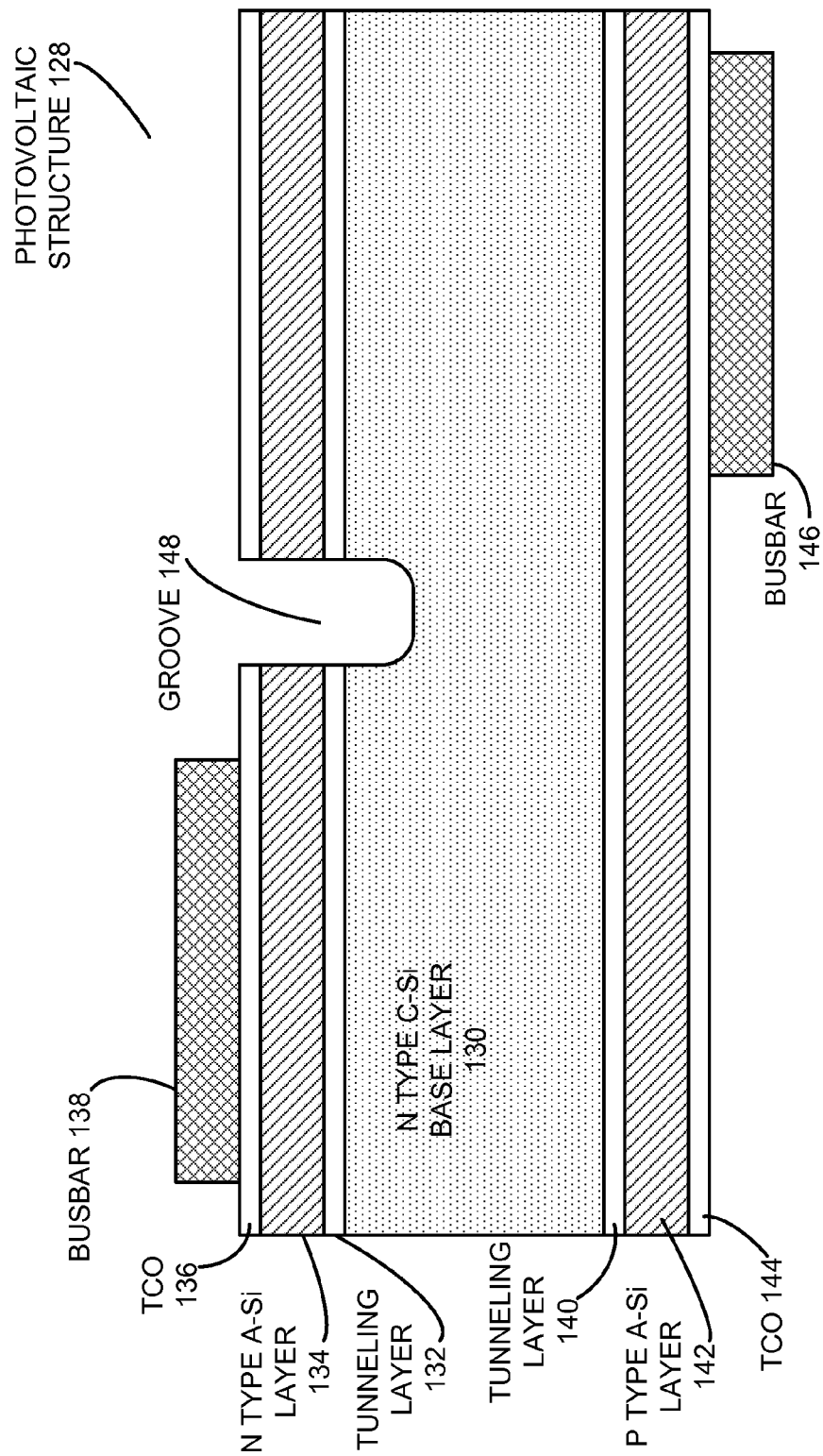
FIG. 1B shows a photovoltaic structure, according to an embodiment of the invention.

FIG. 1B shows one example of a groove that can prevent damage to the emitter junction of a photovoltaic structure during a cleaving process. Photovoltaic structure 128 in this example can include N type lightly doped crystalline silicon (c-Si) base layer 130, intrinsic tunneling layer 132, N type heavily doped amorphous silicon (a-Si) surface field layer 134, transparent conductive oxide (TCO) layer 136, and front-side busbar 138. On the back side, the structure can include intrinsic tunneling layer 140, P type a-Si emitter layer 142, TCO layer 144, and back side busbar 146. The back side tunneling junction, formed by P type a-Si emitter layer 140, intrinsic tunneling layer 140, and N type c-Si base layer 130, can transport away the majority carriers generated by base layer 130. The front side tunneling junction, formed by N type heavily doped a-Si surface field layer 134, intrinsic tunneling layer 132, and base layer 130, can transport away the minority carriers generated by base layer 130, thereby reducing the amount of carrier recombination in base layer 130. Tunneling layers 132 and 140 can passivate the interface between base layer 130 and the two heavily doped a-Si layers while still allowing carriers generated by base layer 130 to enter these a-Si layers due to tunneling effect.

The tunneling junction between base layer 130 and emitter layer 142 is where the majority carriers are removed. It is therefore preferable that the damage caused by scribing and/or cleaving to this interface is kept small. If a laser is used for scribing, the high temperature caused by the laser beam can damage the base-layer-to-emitter junction. Hence, it is desirable to scribe groove 148 on the surface-field-layer side, where groove 148 does not penetrate base layer 130 and reach the base-layer-to-emitter interface. A cleaving process as described herein can be used after the scribing process to attain a clean-cut breakage along the groove. More details of an exemplary photovoltaic structure are provided in U.S. patent application Ser. No. 13/601,441, filed Aug. 31, 2012, entitled "BACK JUNCTION SOLAR CELL WITH TUNNEL OXIDE," the disclosure of which is hereby incorporated by reference in its entirety herein.

Exemplary photovoltaic structure 128 shown in FIG. 1B includes an N type lightly doped c-Si base layer. In general, the base layer can be either N or P type doped, or undoped, and can be made of a variety of materials, including c-Si, a-Si, poly-crystalline silicon, or non-silicon materials. Various device structures and designs based on different materials can also be used to construct the photovoltaic structure. For example, the photovoltaic structure can be a wafer-based photovoltaic structure, or a thin film photovoltaic structure, which might have a size and shape different from those of regular wafers. Preferred embodiments of the present invention provide a system that can cleave a photovoltaic structure along a groove to produce multiple strips without damaging the interface between the base layer and emitter layer of the strips.

For example, for a typical crystalline-Si-based photovoltaic structure with a stack thickness ranging from 200 to 700 microns, the groove depth can range from 5 to 100 microns. Preferably, the groove depth can be up to 30 or 50 microns. In one embodiment, the depth of the groove can be approximately 20 microns. For thin-film-based photovoltaic structures with a smaller stack thickness, the groove depth can be reduced correspondingly. Alternatively, the groove depth can be measured as a percentage of the thickness of the photovoltaic structure. The depth of the groove can be, for example, up to 70% of the thickness of the photovoltaic structure. In one embodiment, the depth of the groove can be 2%-70% of the thickness of the photovoltaic structure. In a further embodiment, the groove depth can be 10%-40% of the structure's thickness. Preferably, the groove depth can be approximately 20% of the structure's thickness.

Some conventional solar panels include a single string of serially connected un-cleaved photovoltaic structures. As described in U.S. patent application Ser. No. 14/563,867, it can be more desirable to have multiple (such as 3) strings, each string including cascaded strips, and connect these strings in parallel. Such a multiple-parallel-string panel configuration can provide the same output voltage with a reduced internal resistance. In general, a photovoltaic structure can be divided into n strips, and a panel can contain n strings, each string having the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string (note that the total resistance of a string made of a number of strips can be a fraction of the total resistance of a string made of the same number of undivided photovoltaic structures). Therefore, in general, the greater n is, the lower the total internal resistance of the panel is, and the more power one can extract from the panel. However, a tradeoff is that as n increases, the number of connections required to inter-connect the strings also increases, which increases the amount of contact resistance. Also, the greater n is, the more strips a single photovoltaic structure needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance is, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, conventional silver-paste or aluminum based electrode may require n to be greater than 4, because process of screen printing and firing silver paste onto a photovoltaic structure does not produce ideal resistance between the electrode and underlying photovoltaic structure. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n is selected to be three, which is less than the n value generally needed for photovoltaic structures with silver-paste electrodes or other types of electrodes. Correspondingly, two grooves can be scribed on a single photovoltaic structure to allow the photovoltaic structure to be divided to three strips.

In addition to lower contact resistance, electro-plated copper electrodes can also offer better tolerance to micro cracks, which may occur during a cleaving process. Such micro cracks might adversely impact silver-paste-electrode photovoltaic structures. Plated-copper electrode, on the other hand, can preserve the conductivity across the surface even if there are micro cracks in the photovoltaic structure. The copper electrode's higher tolerance for micro cracks allows one to use thinner silicon wafers to manufacture photovoltaic structures. As a result, the grooves to be scribed on a photovoltaic structure can be shallower than the grooves scribed on a thicker wafer, which in turn helps increase the throughput of the scribing process. More details on using copper plating to form low-resistance electrode on a photovoltaic structure are provided in U.S. patent application Ser. No. 13/220,532, filed Aug. 29, 2011, entitled "SOLAR CELL WITH ELECTROPLATED GRID," the disclosure of which is incorporated by reference in its entirety.

Figure 1C:
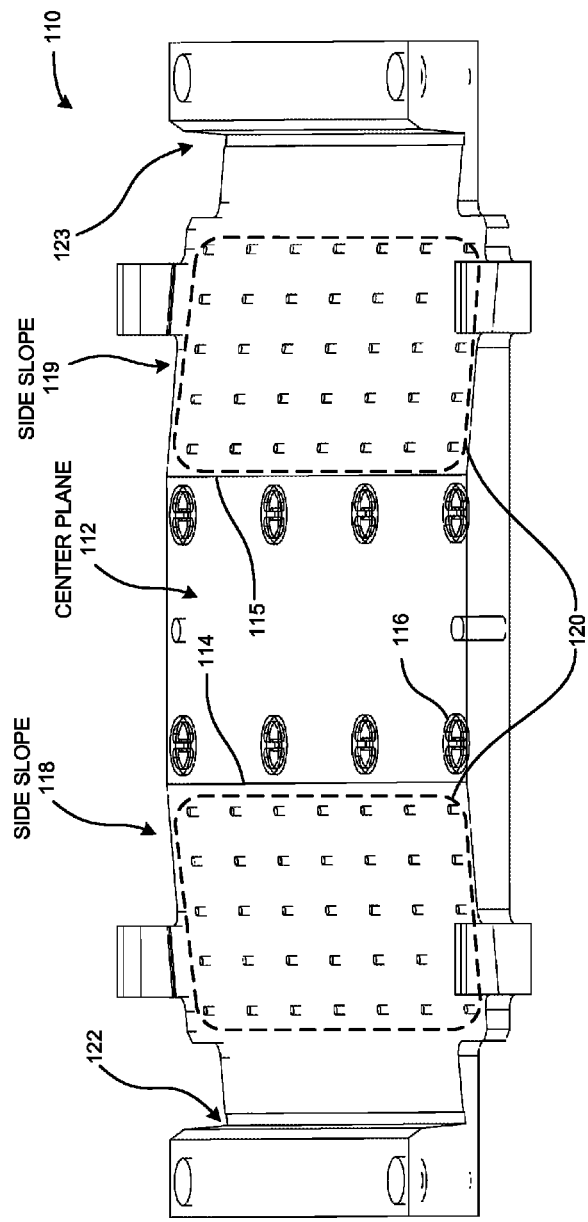
FIG. 1C shows a cleaving base according to one embodiment of the invention.

Cleaving base 110 is designed to cleave the photovoltaic structure along the scribed grooves without causing micro cracks along the electrodes, or damaging the base-layer-to-emitter interface. FIG. 1C illustrates a close-up view of cleaving base 110, according to one embodiment of the invention. Specifically, center plane 112 can provide support underneath a center strip of a photovoltaic structure during the cleaving process, and side slopes 118 and 119 can soften the landing of the outer strips after they are separated from the center strip.

In some embodiments, the suction nozzles (e.g., suction nozzle 116) on center plane 112 may function as a holding apparatus that can hold the photovoltaic structure, without damaging it. For example, the suction nozzles (e.g., suction nozzle 116) may be flush against a top surface of center plane 112. This flush design may prevent damage to the bottom surface of the photovoltaic structure. When the photovoltaic structure rests on center plane 112, the photovoltaic structure's bottom surface may come in contact with a perimeter of the suction nozzles on center plane 112. Activating the suction force can cause the suction nozzles to create a low-pressure area within the perimeter of the suction nozzles. This low-pressure environment can hold down the photovoltaic structure to center plane 112.

Cleaving base 110 can also include cleave fulcrums 114 and 115 that form at an intersecting edge between center plane 112 and side slopes 118 and 119, respectively. The photovoltaic structure may be placed on cleaving base 110 so that cleave fulcrums 114 and 115 may be aligned between the scribed grooves of the photovoltaic structure. In some embodiments, the busbars on the downward-facing surface of the photovoltaic structure may reside outside fulcrums 114 and 115, so they do not become damaged during the cleaving process. When the cleave tips apply pressure to the top surface of the outer strips, fulcrums 114 and 115 can apply pressure near the scribed grooves from underneath the center strip to cause the outer strips to break away from the center strip.

Side slopes 118 and 119 can include a downward slope from the center plane 112, and can prevent the bottom surface of the side strips from becoming damaged after the cleaving process. For example, side slopes 118 and 119 can include air jets 120 that may be pointed in an upward direction, and may release a stream of air in the upward direction to create air buffers that can prevent the side strips from impacting angled side slopes 118 and 119. When the side strips break away from the center strip, the side strips can land on the air buffers, slide down side slopes 118 and 119, and rest against side rails 122 and 123.

Figure 1D:
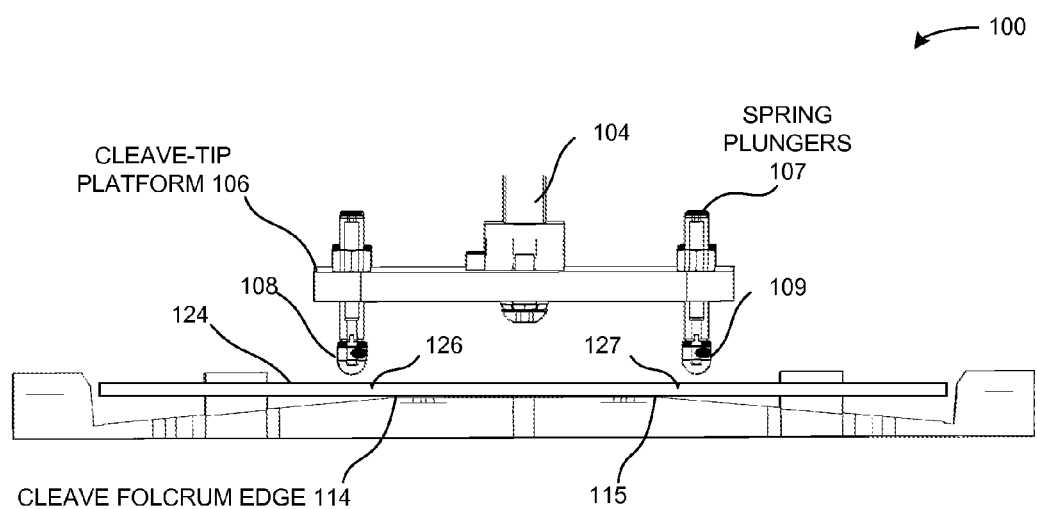
FIG. 1D shows a set of cleave tips according to one embodiment of the invention.

FIG. 1D shows a side view of a set of cleave tips 108 and 109 pressing down on two outer regions of photovoltaic structure 124, according to one embodiment of the invention. Two scribed grooves 126 and 127 on photovoltaic structure 124 may be oriented outside of cleave fulcrum edges 114 and 115, and between cleave tips 108 and 109.

In some embodiments, cleave tips 108 and 109 may prevent unnecessary and excessive pressure from being applied to the top surface of photovoltaic structure 124. For example, cleave tips 109 can be partially housed inside spring plungers 107, and a spring may be placed inside spring plungers 107 to absorb some of the pressure exerted by actuator 104. If actuator 104 lowers cleave-tip platform 106 with too much downward pressure (e.g., a pressure greater than a predetermined cleaving pressure), spring plungers 106 may absorb the additional pressure. The amount of downward pressure that may be used during cleaving can be adjusted by adjusting or changing the springs inside spring plungers 107.

In some embodiments, photovoltaic structure 124 may be divided by applying a temperature differential in addition to, or instead of, the cleaving process. In this embodiment, a temperature gradient may be formed. For example, the center strip can be exposed to one temperature (e.g., a low temperature) while the side strips can be exposed to another temperature (e.g., a higher temperature). As a result of the temperature differential, photovoltaic structure 124 can be induced to separate between the two temperature regions.

If the temperature gradient is formed during the cleaving process, the temperature gradient may decrease the amount of force that is necessary for cleave tips 108 to break the side strips away from the center strip. This decreased force from cleave tips 108 can decrease the amount of warping that may be incurred by photovoltaic structure 124 during the cleaving process, which in turn can prevent damage to the structure of the cleaved strips. For example, decreasing the stress or strain incurred on a strip during the cleaving process can prevent micro cracks from forming on the busbars or fingerlines of the strip.

Figure 2A:
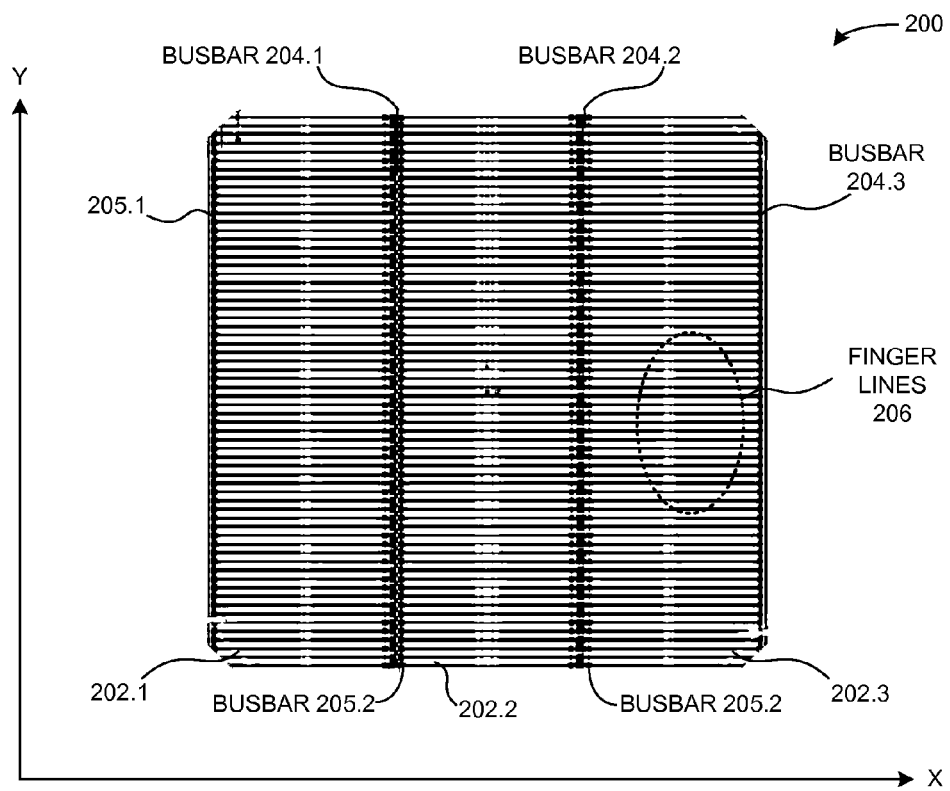
FIG. 2A shows a photovoltaic structure according to one embodiment of the invention.

FIG. 2A shows photovoltaic structure 200, according to one embodiment of the invention. Photovoltaic structure 200 can include three photovoltaic strips 202.1, 202.2, and 202.3, which can be the result of photovoltaic structure 200 having an electroplated copper electrode that exhibits low contact resistance. Each strip can include a number of substantially parallel finger lines, such as finger lines 206, arranged in the X direction. These finger lines can collect the carriers generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 202.1 can have busbar 204.1 on the top surface, and busbar 205.1 on the bottom surface. Similarly, strip 202.2 can have busbars 204.2 and 205.2 on the top and bottom surfaces, respectively, and strip 202.3 can have busbars 204.3 and 205.3 on the top and bottom surfaces, respectively. In one embodiment, photovoltaic structure 200 can be scribed near and along busbars 204.1 and 204.2, which allows photovoltaic structure 200 to be subsequently cleaved into three strips along these grooves. Additional busbars may be added to either surface to reduce resistance.

Figure 2B:
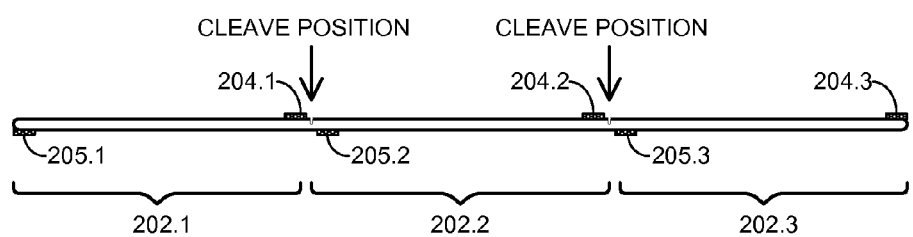
FIG. 2B shows a cross-sectional view of a photovoltaic structure prior to being cleaved according to one embodiment of the invention.

FIG. 2B shows a cross-sectional view of photovoltaic structure 200 prior to being cleaved, according to one embodiment of the invention. Two scribed grooves can be located between busbars 204.1 and 205.2, and between busbars 204.2 and 205.3, respectively. These grooves correspond to the cleave positions. After the subsequent cleaving process, the entire photovoltaic structure can be divided, for example, to three strips 202.1, 202.2, and 202.3.

Figure 2C:
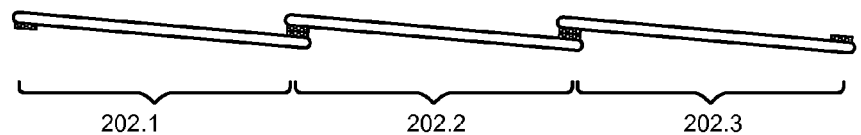
FIG. 2C shows a cascaded arrangement of three strips after a photovoltaic structure is cleaved according to one embodiment of the invention.

FIG. 2C shows a cascaded arrangement of three strips after a photovoltaic structure is cleaved, according to one embodiment of the invention. In this example, three strips 202.1, 202.2, and 202.3 can be arranged in a cascaded manner, such that the positive-side busbar of one strip overlaps and is electrically coupled to the negative-side busbar of the neighboring strip. A conductive paste can be applied between two facing busbars to facilitate both low-resistance contact and physical bonding. Because no conductive tabs or wires are used, such a cascading arrangement can reduce the series resistance due to inter-connection between to strips, and can improve the fill-factor of the panel.

Figure 2D:
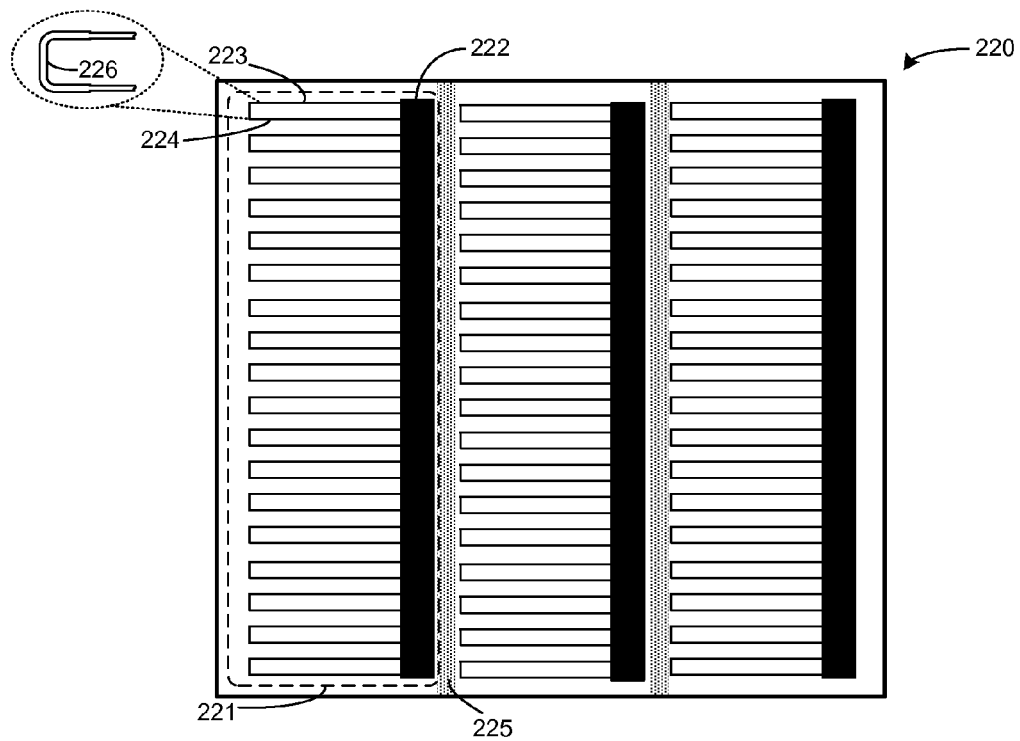
FIG. 2D shows an exemplary conductive grid and blank space pattern on the front surface of a photovoltaic structure, according to one embodiment.

FIG. 2D shows an exemplary conductive grid and blank space pattern on the front surface of a photovoltaic structure, according to one embodiment. In the example shown in FIG. 2D, conductive grid 220 can be made of any electrically conductive material, including metallic and non-metallic materials. Conductive grid 220 can include three sub-grids, such as sub-grid 221. The photovoltaic structure can also include a blank space (i.e., space not covered by electrodes) between neighboring sub-grids, such as blank space 225. The blank space provides the area where scribing and cleaving can occur. Because the blank space is not covered with any conductive material, the scribing and cleaving can occur without contacting the electrode. Each sub-grid can function as the front-side grid for the corresponding strip. Hence, this sub-grid-and-blank-space configuration can allow the photovoltaic structure to be divided into three strips. In general, a respective sub-grid can have various types of patterns. For example, a sub-grid can have two, instead of one, busbars, or a single busbar placed in the center of the strip. In the example shown in FIG. 2D, the sub-grids can each have a single busbar pattern placed on the edge, which allows the strips to be cascaded.

Figure 2E:
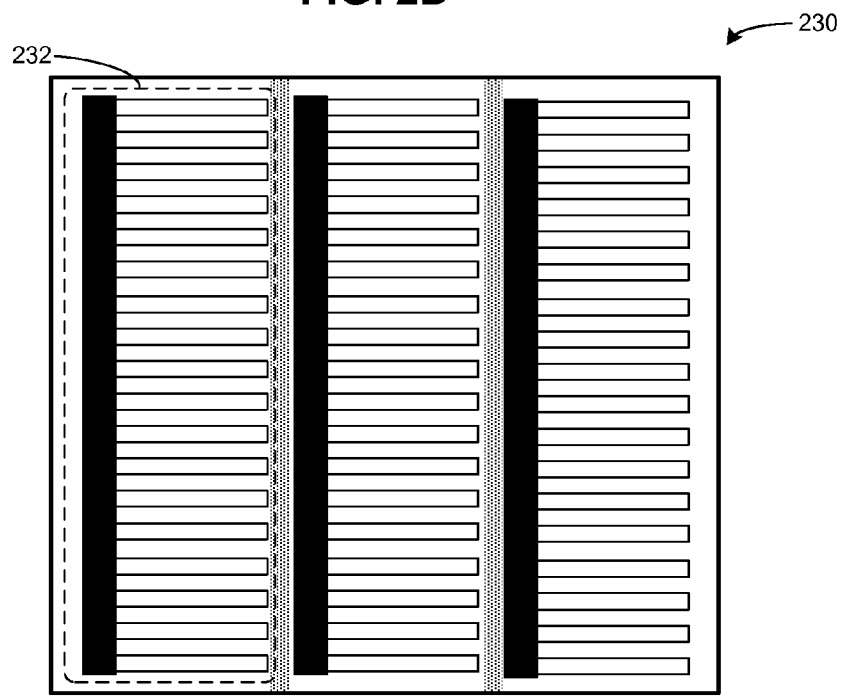
FIG. 2E shows an exemplary conductive grid and blank space pattern on the back surface of a photovoltaic structure, according to one embodiment of the invention.

FIG. 2E shows an exemplary conductive grid and blank space pattern on the back surface of a photovoltaic structure. In this example, back conductive grid 230 can include three sub-grids. In one embodiment, the back side sub-grids may correspond to the front side sub-grids. As a result, the back side of the strips can also absorb light to generate electrical energy, thereby allowing the solar panel to operate in a bifacial manner. In the embodiment shown in FIGS. 2D and 2E, the front and back side sub-grids can have similar patterns except that the front and back edge-busbars are located near opposite edges of the strip. In other words, the busbar on the front side of the strip may be located at one edge, and the busbar on the back side may be located at the opposite edge. In addition, the locations of the blank spaces on the back side may be aligned with the locations of the blank spaces on the front side, such that the conductive grid lines may not interfere with the subsequent cleaving process.

In the embodiment shown in FIGS. 2D and 2E, each sub-grid may include an edge-busbar running along the longer edge of the corresponding strip and a plurality of parallel finger lines running in a direction substantially parallel to the shorter edge of the strip. For example, in FIG. 2D, sub-grid 221 may include edge-busbar 222, and a number of finger lines, such as finger lines 223 and 224. A blank space, which is not covered by any conductive material, can be placed between two adjacent sub-grids to facilitate the subsequent scribe and cleaving process. Note that in FIG. 2D the ends of the finger lines can be connected by a conductive line to form "loops." This type of "looped" finger line pattern can reduce the likelihood of the finger lines from peeling away from the photovoltaic structure after a long period of usage. For example, as shown in FIG. 2D, finger lines 223 and 224 are connected by conductive line 226 to form a loop with rounded corners. Optionally, the sections where the finger lines are joined can be wider than the rest of the finger lines to provide more durability and prevent peeling. Other finger line patterns, such as un-looped straight lines or loops with different shapes, are also possible.

As shown in FIG. 2D, strip-shaped blank space 225, shown in a shaded rectangle, can separate sub-grid 221 from its adjacent sub-grid. The width of the blank space, such as blank space 225, is chosen to provide sufficient area for the scribing process (e.g., using a laser scribe system) without causing any potential damage to the nearby electrodes, and yet sufficiently narrow so that the electrodes can reach the edge of each strip and provide low-resistance collection of the carriers. There may be a tradeoff between a wider blank space that facilitates more error-tolerant scribing operation and a narrower blank space that results in more effective current collection. In one embodiment, the blank space width can be between 0.5 mm and 2 mm. In a further embodiment, the width of such a blank space may be 1 mm.

Figure 2F:
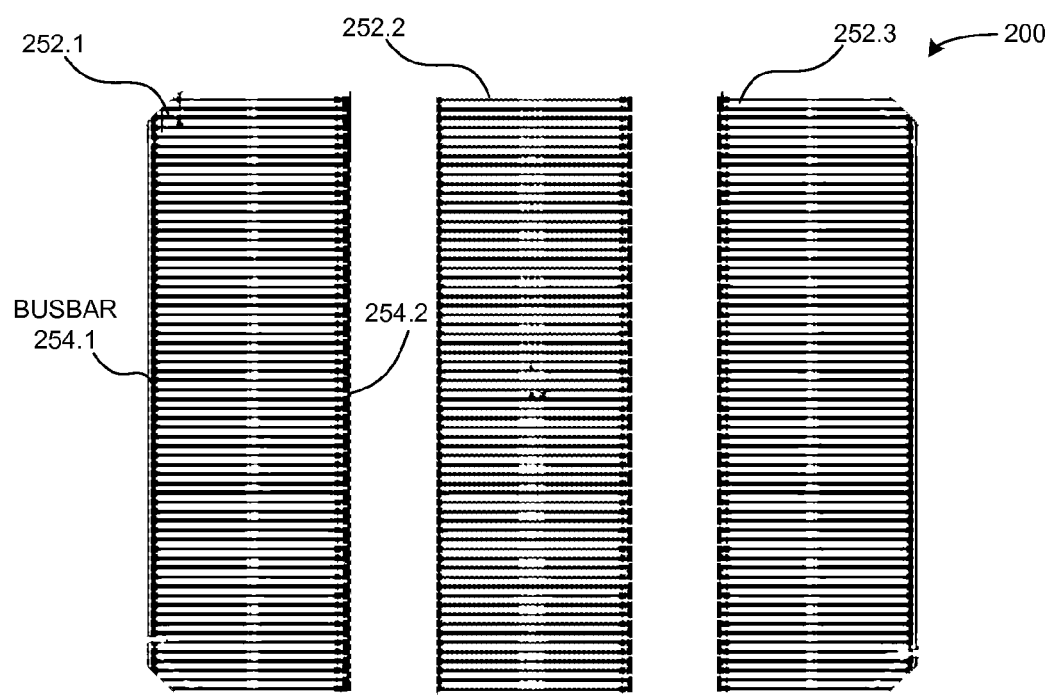
FIG. 2F shows multiple strips according to one embodiment of the invention.

As mentioned above, in order to prevent damage to the emitter junction of the photovoltaic structure, the scribing operation may be performed on the surface corresponding to the surface field layer. For example, if the emitter junction is on the front side of the photovoltaic structure, the scribing may occur to the back surface of the photovoltaic structure. On the other hand, if the emitter junction is on the back side, the scribing may occur on the front surface of the photovoltaic structure. FIG. 2F shows multiple strips 252.1, 252.2, and 252.3, which are the result of separating a photovoltaic structure along a set of grooves, according to one embodiment of the invention. Each strip can include two busbars, one on each side, on opposite edges. For example, strip 252.1 can include separate busbars 254.1 and 254.2 on the front side and back side, respectively.

Cleaving Assembly Line

Figure 3:
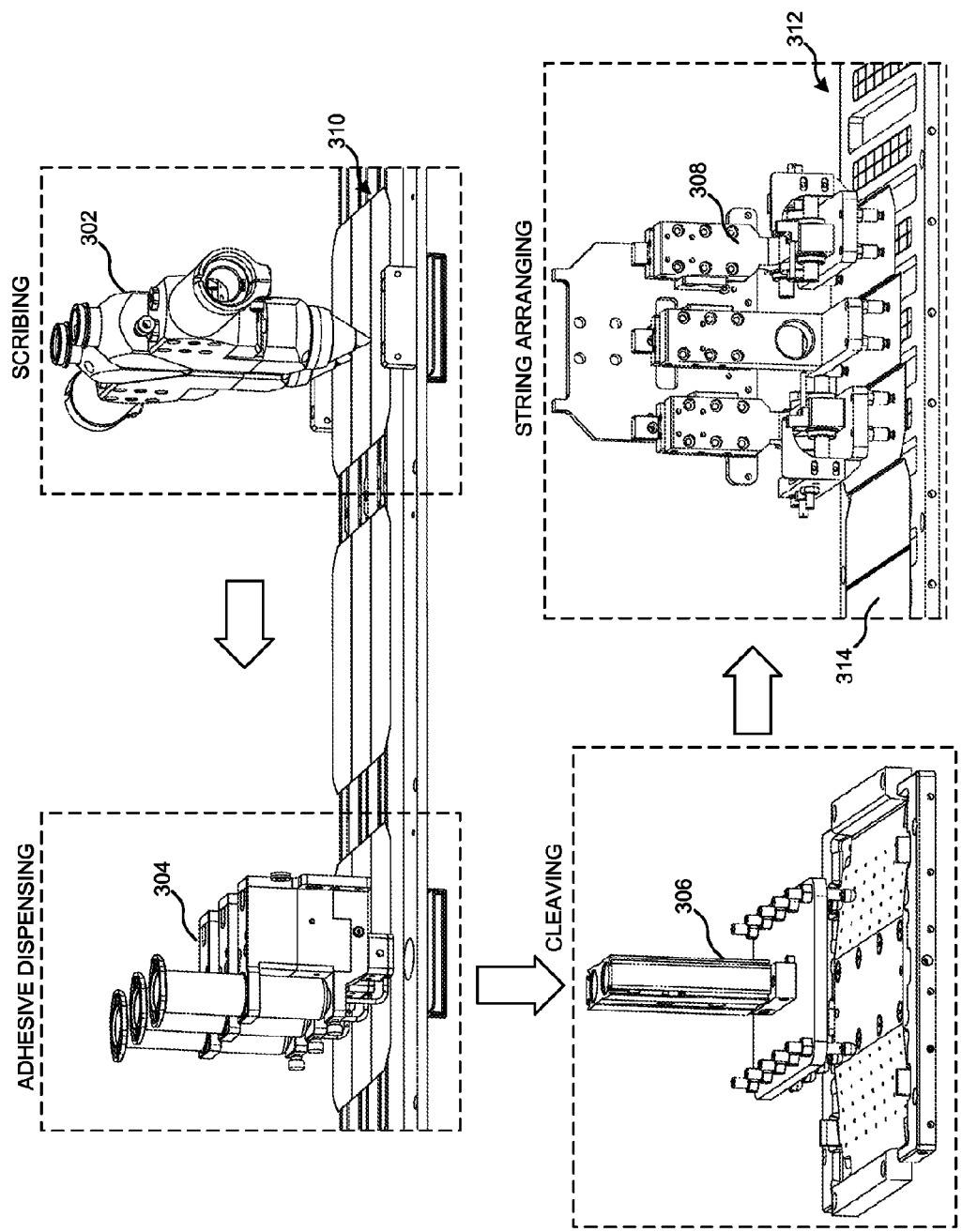
FIG. 3 shows a sequence of steps for processing photovoltaic structures to produce a string according to one embodiment of the invention.

FIG. 3 shows a sequence of steps for processing photovoltaic structures to produce a string, according to one embodiment of the invention. In this example, conveyor 310 can move photovoltaic structures to scribing system 302, which can scribe one or more grooves along the busbars of each photovoltaic structure. Conveyor 310 can then move the photovoltaic structures to adhesive-dispensing system 304, which can dispense a conductive adhesive paste on busbars of the strips, so that after cleaving these strips can be bonded together in a cascaded arrangement.

After application of the conductive adhesive paste, the photovoltaic structures can be picked up from conveyor 310 by, for example, a robotic arm (not shown) via a suction device that may be integrated into the robotic arm. The robotic arm can hold the photovoltaic structure by maintaining the suction force while moving the photovoltaic structure toward cleaving system 306. The robotic arm can rotate photovoltaic structures approximately 90 degrees before placing it onto a loading system of cleaving system 306. The loading system may also include a buffer where the photovoltaic structures can be stored before being moved to cleaving system 306.

Cleaving system 306 can receive photovoltaic structures from the loading system, and cleave the photovoltaic structures into strips along the grooves formed by scribing tool 302. After a photovoltaic structure is cleaved into a number of (e.g., three) strips, string-arrangement system 308 can lift these strips and arrange the strips in a cascaded arrangement while moving the strips to string-processing table 312. String-arrangement system 308 can overlap a leading edge of the three cascaded strips over the trailing edge of a previously formed string 314, thereby extending string 314.

The sequence of operations shown in FIG. 3 is one of many ways to manufacture cascaded strings. For example, the step of applying the conductive adhesive paste can occur before scribing or after cleaving. Furthermore, a variety of apparatuses and systems can be used to implement the functions showing in FIG. 3.

Figure 4:
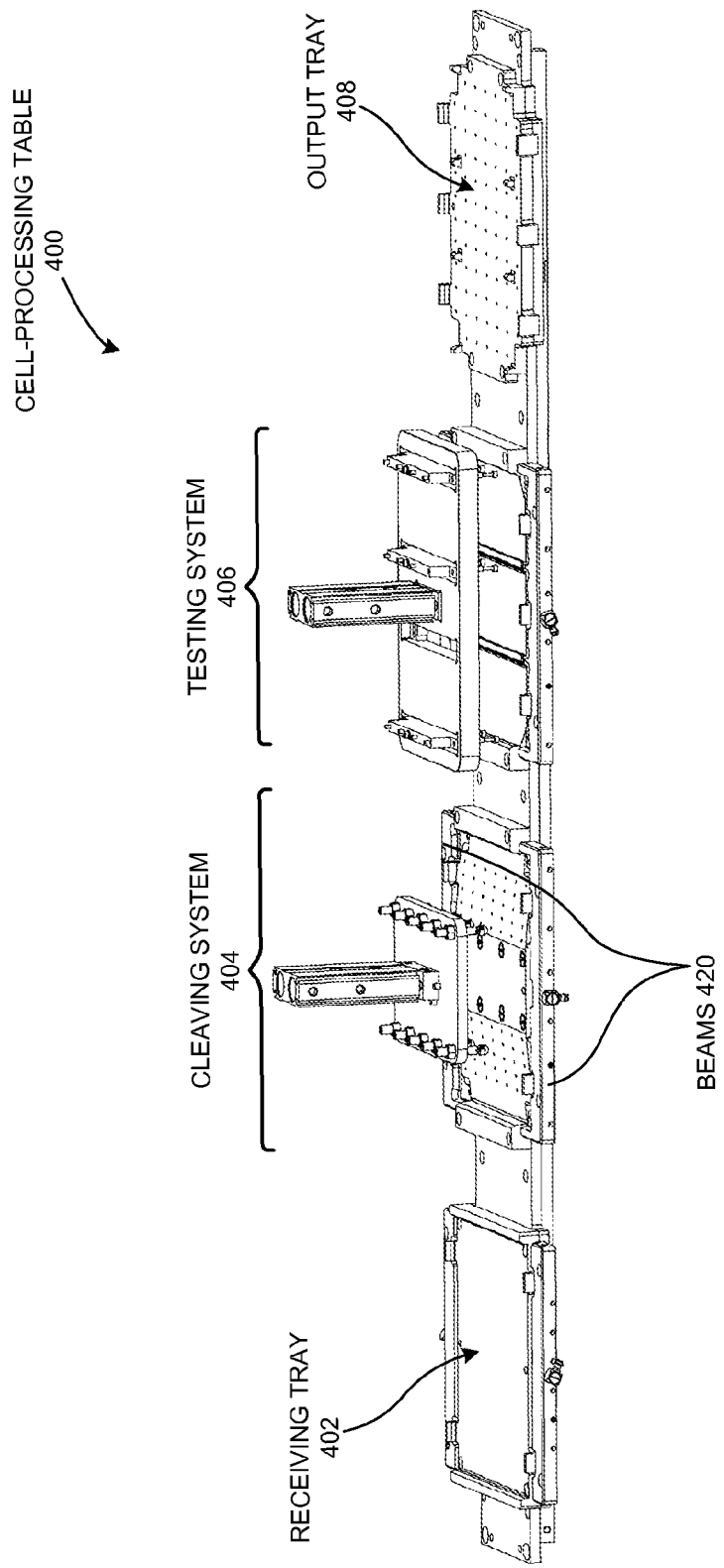
FIG. 4 shows a cleaving system on a cell-processing table according to one embodiment of the invention.

FIG. 4 shows cleaving system 404 on a cell-processing table 400, according to one embodiment of the invention. Cell-processing table 400 can include four stations: receiving tray 402, cleaving system 404, testing apparatus 406, and output tray 408. A cell-handling robot can deposit a previously scribed photovoltaic structure into receiving tray 402. Cleaving system 404 may cleave the photovoltaic structure into multiple strips. Testing apparatus 406 may then test the electrical properties of the individual strips. The tested strips can be placed in output tray 408.

In one embodiment, photovoltaic structures can be shifted from one station to another by a cell-shifting device, such as a conveyor or a mechanical apparatus. For example, a beam-shifting apparatus (not shown) can lift a set of beams (e.g., beams 420) to carry a photovoltaic structure (or the individual strips) to the next station by shifting the beams along cell-processing table 400 and resting the beams at the next station.

In some embodiments, cell-processing table 400 can have three pairs of beams for the four processing stations. The beam-shifting apparatus can shift a photovoltaic structure on a pair of beams to a vacant station from a previous station, and in some embodiments, it can do so while the other stations may be processing another photovoltaic structure. For example, when output tray 410 becomes vacant, and testing apparatus 406 completes a test procedure on a set of cleaved strips, the beam-shifting apparatus can lift the beams to move the strips from testing apparatus 406 to output tray 410.

Once cleaving system 404 finishes cleaving a photovoltaic structure, the beam-shifting apparatus can lift a pair of beams at cleaving system 404 to move those cleaved strips to testing apparatus 406. The beam-shifting apparatus may then lift a pair of beams at receiving tray 402 to move an incoming photovoltaic structure to cleaving system 404. The beam-shifting apparatus may then reset the beams by moving the empty beams from output tray 408 to receiving tray 402, and can repeat the process.

Figure 5A:
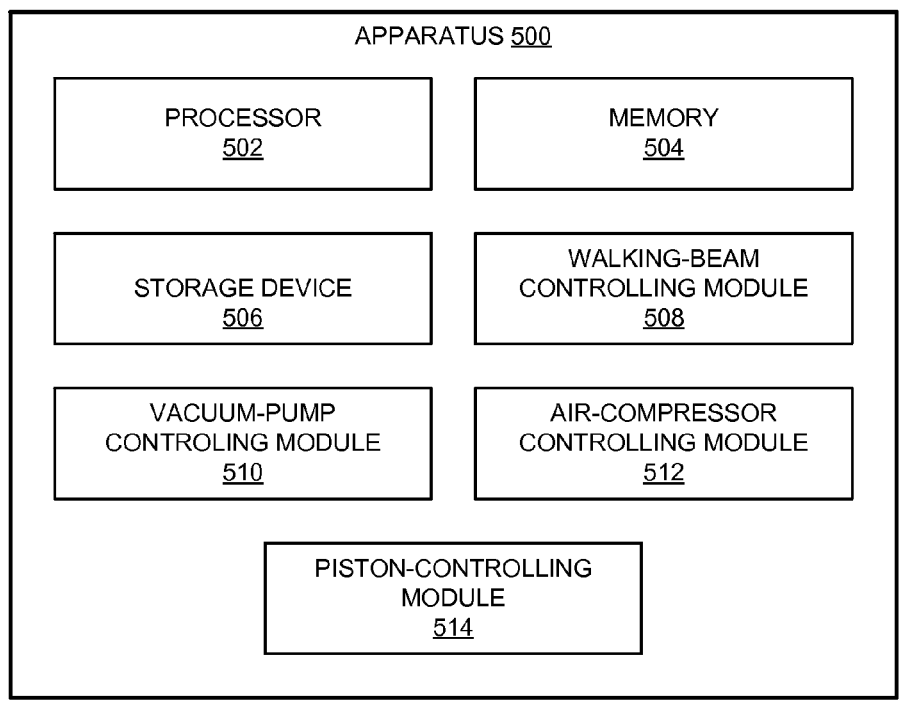
FIG. 5A shows an exemplary cleave-controlling apparatus according to one embodiment of the invention.

FIG. 5A shows an exemplary cleave-controlling apparatus 500 that can facilitate separating a photovoltaic structure into multiple strips, according to one embodiment of the invention. Apparatus 500 can include a plurality of modules which may communicate with one another via a wired or wireless communication channel. Apparatus 500 may be realized using one or more integrated circuits, and may include fewer or more modules than those shown in FIG. 5A. Further, apparatus 500 may be integrated in a computer system, or realized as a separate device which is capable of communicating with other computer systems and/or devices.

Cleave-controlling apparatus 500 can include processor 502, memory 504, and storage device 506. Memory 504 can include a volatile memory (e.g., RAM) that serves as a managed memory, and can be used to store one or more memory pools. In some embodiments, storage device 506 can store an operating system, and instructions for monitoring and controlling the cleaving process.

Apparatus 500 can also include walking-beam controlling module 508, vacuum-pump controlling module 510, air-compressor controlling module 512, and piston controlling module 514. Walking-beam controlling module 508 can control an actuator that may shift a walking beam to move photovoltaic structures onto a cleaving base, and can move the cleaved strips out of the cleaving base. Vacuum-pump controlling module 510 can control a vacuum pump that may apply a suction force to a plurality of suction nozzles of the cleaving base, and air-compressor controlling module 512 can control an air compressor that may apply a positive airflow to a plurality of air jets of the cleaving base. Piston-controlling module 514 can control a pneumatic pump, hydraulic pump, or servo motor for extending or contracting pistons of a cleave head's actuator. Extending the pistons can cause a set of cleave tips to separate two side strips of the photovoltaic structure from the center strip along a pair of scribed grooves.

Figure 5B:
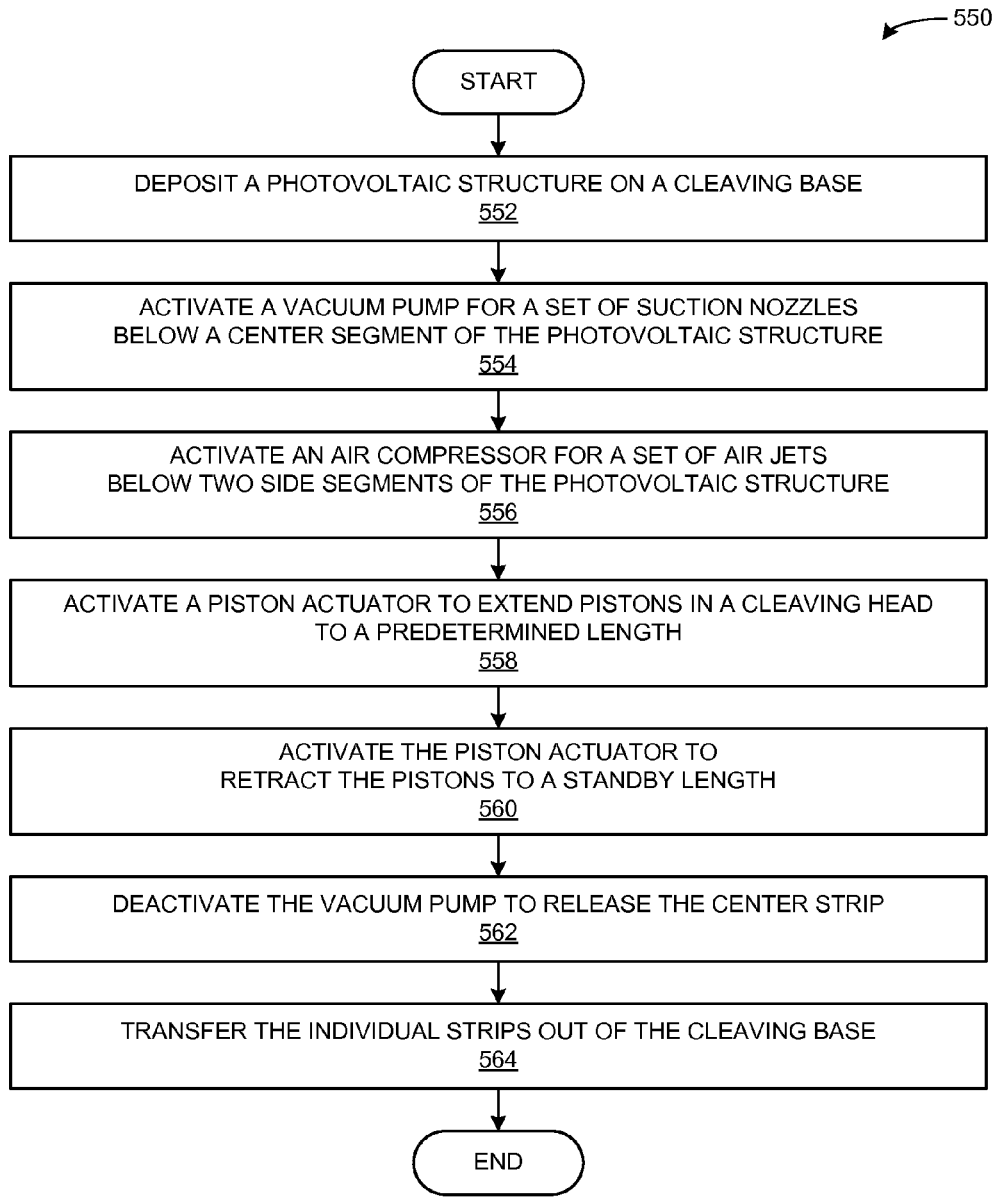
FIG. 5B shows a method for separating a photovoltaic structure into multiple strips according to one embodiment of the invention.

FIG. 5B shows a flow-chart illustrating method 550 for separating a photovoltaic structure into multiple strips, according to one embodiment of the invention. During operation, the system can configure the walking-beam controlling module to deposit a photovoltaic structure on a cleaving base (operation 552), and can configure the vacuum-pump controlling module 510 to activate the vacuum pump for a set of suction nozzles on the center plane of the cleaving base (operation 554). The vacuum pump can cause a suction force along the suction nozzles to hold down the center region of the photovoltaic structure. In some embodiments, the system can also configure the air-compressor controlling module to activate an air compressor for a set of air jets on the side slopes of the cleaving base (operation 556), if the air compressor is not already active. The positive airflow ejected by the air jets may soften the landing of the side strips of the photovoltaic structure as they break away from the center strip.

The system can then configure the piston-controlling module to extend the pistons in the cleaving head to a predetermined length (operation 558). Various driving systems, such as servo motor, hydraulics-based actuators, or pneumatic-based actuators can be used to drive the pistons. For example, extending the pistons can involve controlling a pneumatic pump or hydraulic pump to force a gas or liquid into the pistons, or can involve providing an electric current to a servo motor that extends a shaft in the pistons. As the pistons extend toward this predetermined length, the cleave tips below the cleave-tip platform can cause the side regions of the photovoltaic structure to break away from the center region. Once the pistons reach the predetermined length, the system may configure the piston-controlling module to retract the pistons back to a standby length (operation 560).

The system may then complete the process by configuring the vacuum-pump controlling module to deactivate the vacuum pump to release the center strip (operation 562). The system can then configure the walking-beam controlling module to move the individual (cleaved) strips out of the cleaving base (operation 564) to prepare the cleaving base for the next photovoltaic structure.

Figure 6A:
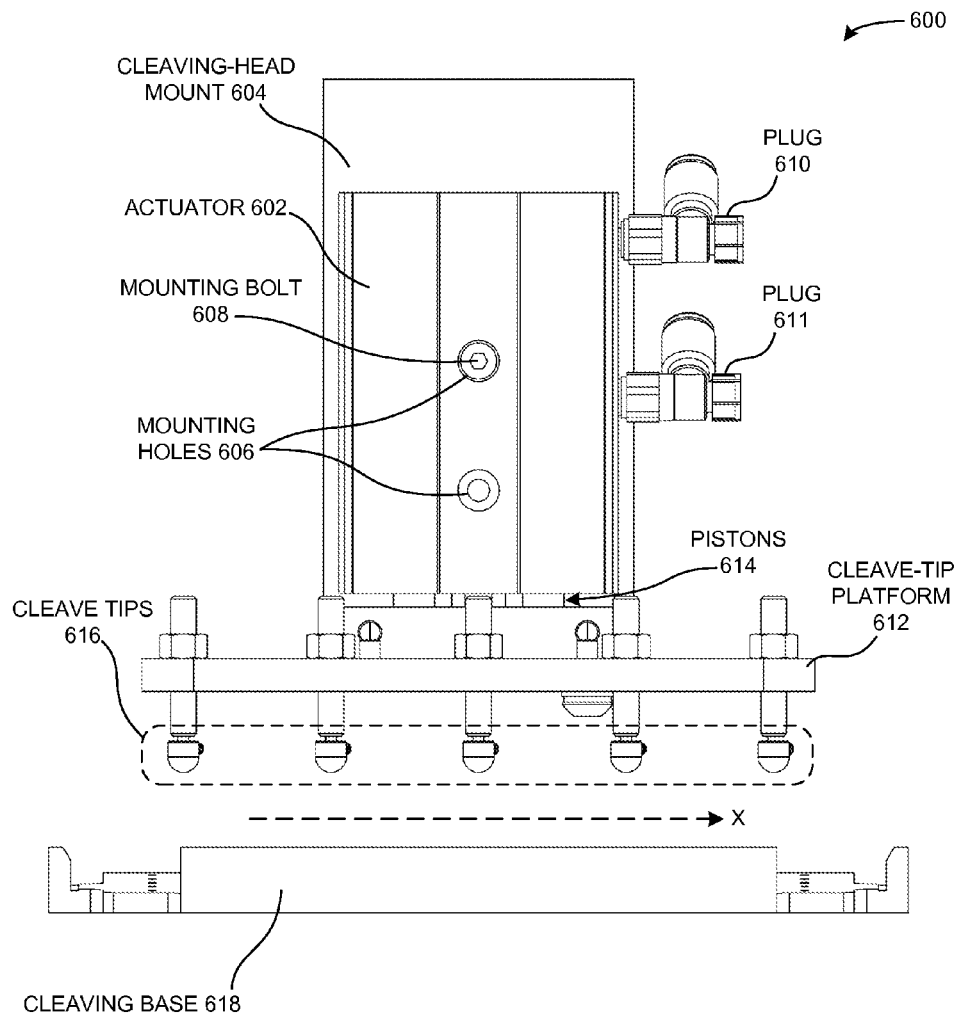
FIG. 6A shows a side view of cleaving system according to one embodiment of the invention.

FIG. 6A shows a side view of cleaving system 600, according to one embodiment of the invention. Actuator 602 can be mounted on a cleaving-head mount 604 using a set of mounting holes 606. In this example, actuator 602 may be fastened to cleaving-head mount 604 by a mounting bolt 608 inserted in one of mounting holes 606. It is possible to fasten actuator 602 to cleaving-head mount 604 using both mounting holes 606, or a larger number of mounting holes.

Cleave-tip platform 612 can be attached to actuator 602 via a set of pistons 614. Pistons 614 may extend when air or hydraulic fluid is inserted into plugs 610 and 611, and may contract when the air or hydraulic fluid is extracted from pistons 614 via plugs 610 and 611. Cleave-tip platform 612 may include a set of elevated cleave tips 616 that can elevate over a cleaving base 618. When pistons 614 extend, pistons 614 can lower elevated cleave tips 616 toward the top surface of cleaving base 618.

In one embodiment, each cleaving tip's vertical position can be adjusted by, for example, a set screw. For example, a row of cleave tips 616 can be arranged to have a gradually lowering heights along an X direction. As pistons 614 extend to lower cleave-tips 616 toward the photovoltaic structure, the left-most cleave tip along the X-axis, for example, can make contact with a strip that is not under a suction hold prior to the rest of the cleave tips in the same row. This contact between the left-most cleave tip and the top surface of the strip can initiate the cleaving or breaking action that begins at one edge of the photovoltaic structure. As pistons 614 continue to lower cleave tips 616, the rest of cleave tips sequentially make contact with the top surface of the strips to continue the breaking action along the X direction. This sequential breaking action can further improve the quality of the cleaved interface.

In further embodiments, it is also possible to use other geometrical shapes for the portion of the cleaving system that contacts the photovoltaic structure. For example, the cleaving tips can be replaced by an elongated cleaving pad positioned at a slight angle from the horizontal position. Then, as the cleaving head is lowered, the cleaving pad can create a downward force on the photovoltaic structure that breaks its side strips away from its center strip in a breaking motion that can follow the X-direction.

Figure 6B:
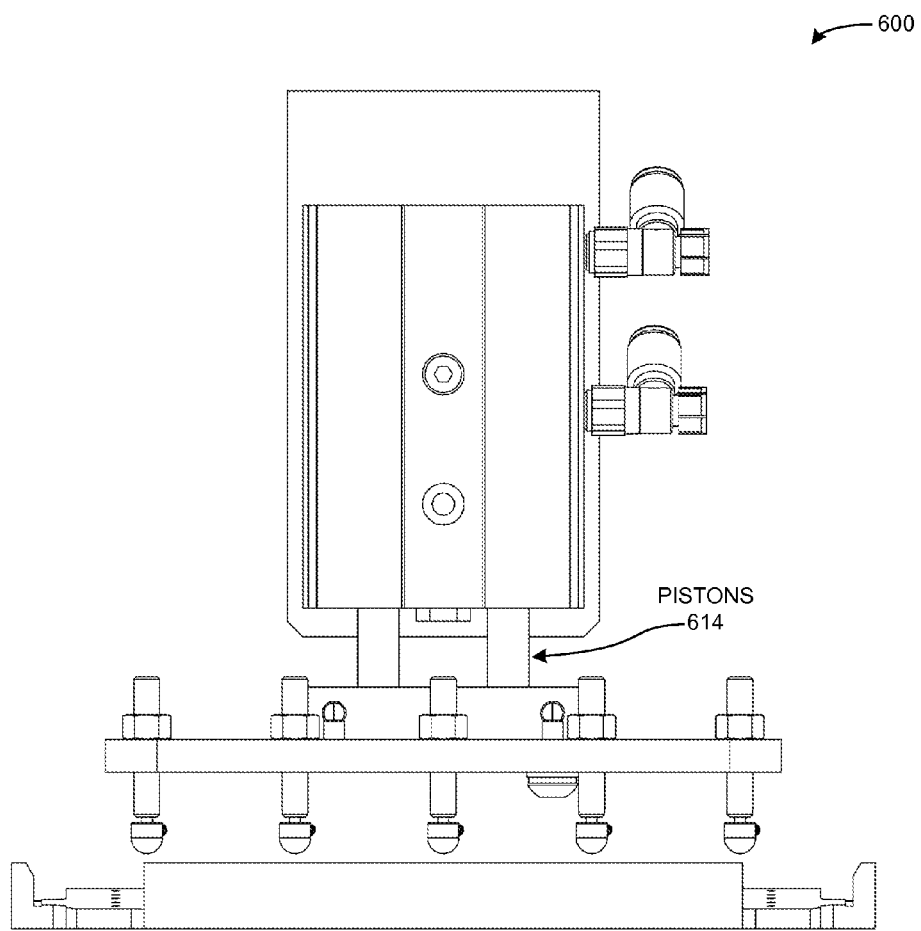
FIG. 6B shows a cleaving system with extended pistons according to one embodiment of the invention.

FIG. 6B shows cleaving system 600 with extended pistons 614, according to one embodiment of the invention.

Figure 7:
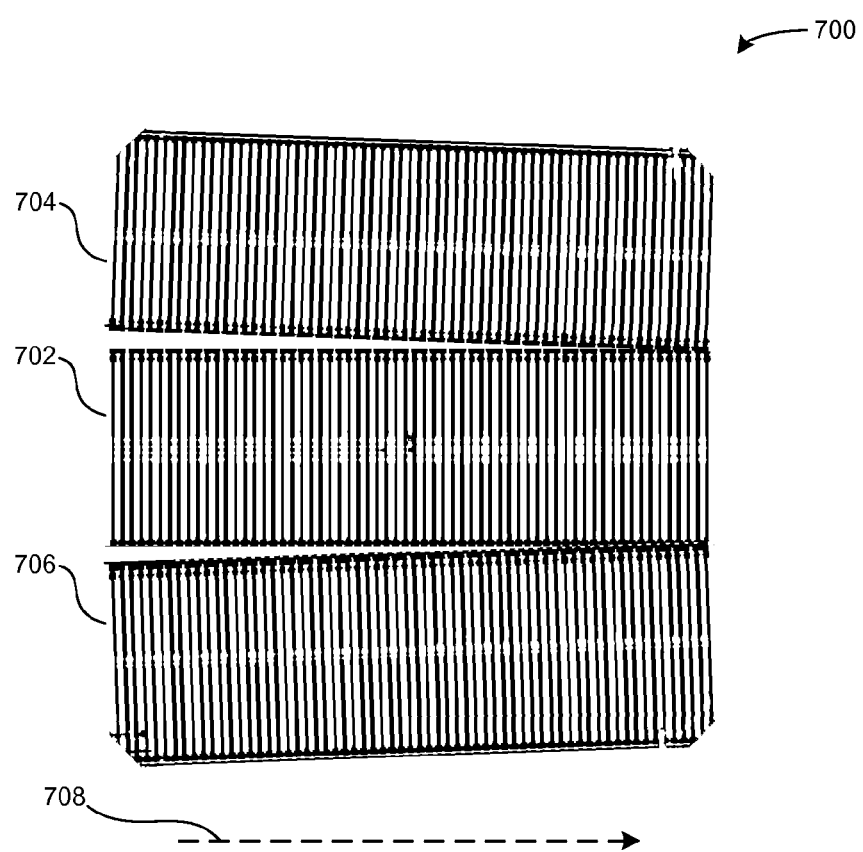
FIG. 7 shows a photovoltaic structure divided into multiple strips according to one embodiment of the invention.

FIG. 7 shows photovoltaic structure 700 divided into multiple strips, according to one embodiment of the invention. Center strip 702 of photovoltaic structure 700 can be held down by the cleaving base, while a set of cleave tips may cause strips 704 and 706 to break away from strip 702. Arrow 708 illustrates a direction for the sequence in which the cleave tips may make contact with strips 704 and 706, which in turn causes strips 704 and 706 to break away from strip 702 in the same direction.

Figure 8:
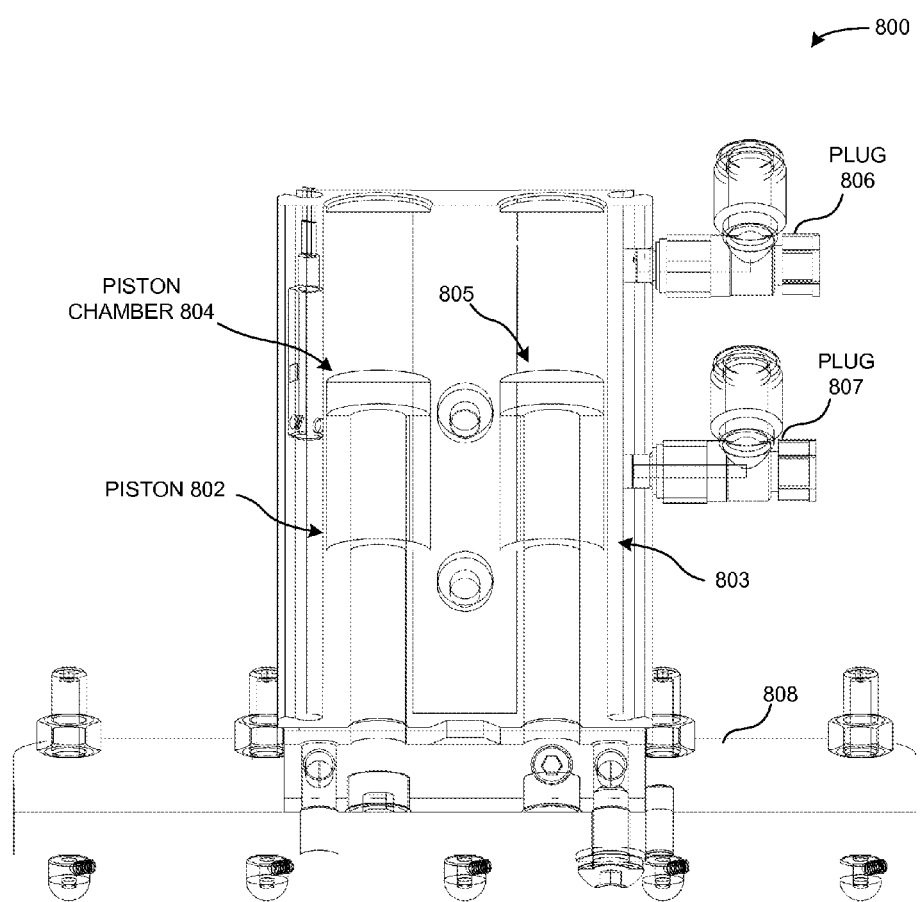
FIG. 8 shows a cross-section of an actuator according to one embodiment of the invention.

FIG. 8 shows a cross-section of an actuator, according to one embodiment of the invention. In this example, actuator 800 can include a set of piston chambers 804 and 805, which may house pistons 802 and 803, respectively. Actuator 800 can also include a set of plugs 806 and 808, and a set of channels (not shown) that span from a plug to a corresponding piston chamber. When air or hydraulic fluid is injected into a piston chamber via the corresponding plug and channel, the increase in pressure in the piston chamber to a level above the exterior atmospheric pressure may cause the corresponding piston to extend, which can result in cleave-tip platform 808 lowering toward a cleaving base. Also, when the air or hydraulic fluid is removed from the piston chamber, the decrease in pressure to below the exterior atmospheric pressure can cause the corresponding piston to contract, which in turn can lift cleave-tip platform 808.

Figure 9A:
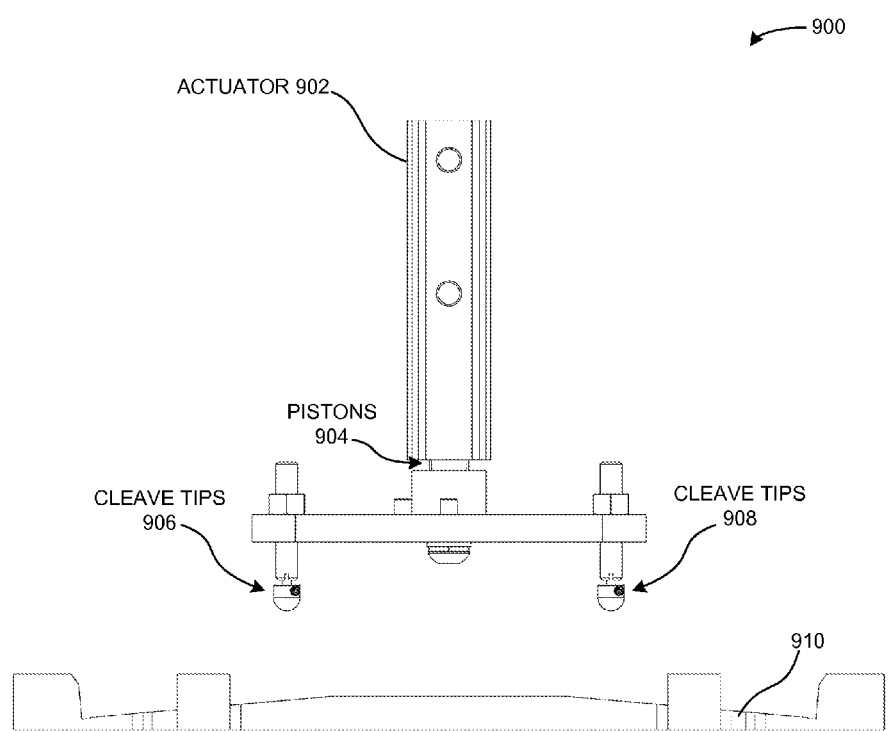
FIG. 9A shows another view of cleaving system according to one embodiment of the invention.

FIG. 9A shows another view of cleaving system 900, according to one embodiment of the invention. In this view, pistons 904 may be retracted into actuator 902, which can raise cleave tip rows 906 and 908 to a standby height above cleaving base 910.

Figure 9B:
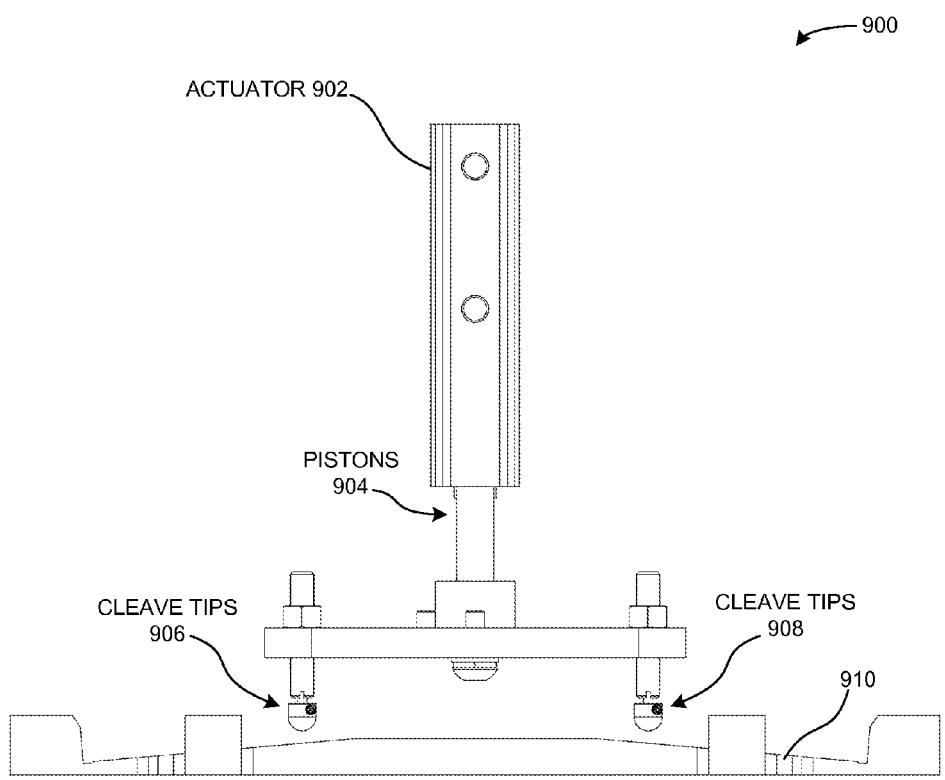
FIG. 9B shows a side view of a cleaving system with extended pistons according to one embodiment of the invention.

FIG. 9B shows a side view of cleaving system 900 with extended pistons 904, according to one embodiment of the invention. In this view, pistons 904 may be extending out of actuator 902, which can lower cleave tip rows 906 and 908 toward cleaving base 910.

Figure 10:
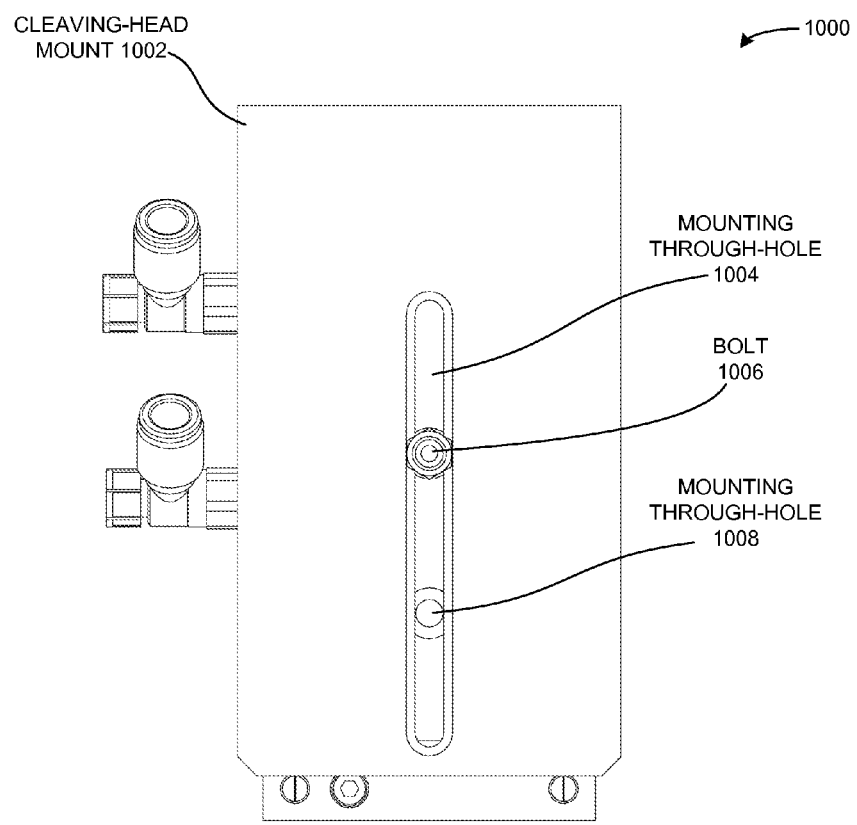
FIG. 10 shows a through-hole for a mounting cleaving apparatus according to one embodiment of the invention.

FIG. 10 shows a through-hole for mounting cleaving apparatus 1000 according to one embodiment of the invention. Cleaving apparatus 900 can be mounted on cleaving-head mount 1002, which itself can be affixed to an overhanging beam (not shown). Cleaving-head mount 1002 can include mounting through-hole 1004 that, for example, can be used to fasten an actuator to cleaving-head mount 1002 using a bolt 1006. In some embodiments, mounting through-hole 1004 can have a vertically elongated shape that can allow raising or lowering an elevation of the actuator prior to tightening bolt 1006. Moreover, the elongated shape of mounting through-hole 1004 allows using multiple bolts to fasten the actuator to cleaving-head mount 1002 (e.g., by also inserting and fastening a bolt to mounting through-hole 1008 on the actuator).

Figure 11:
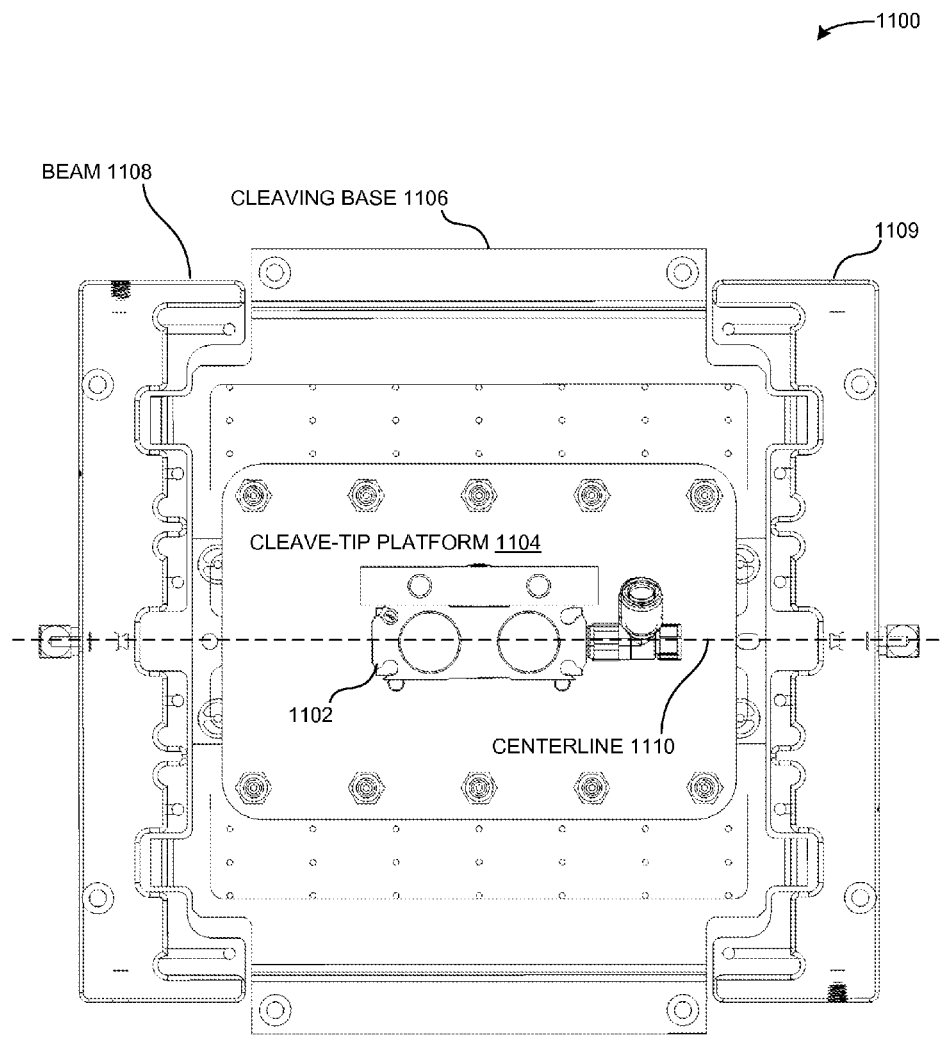
FIG. 11 shows a top view of a cleaving system according to one embodiment of the invention.

FIG. 11 shows a top view of cleaving system 1100, according to one embodiment of the invention. Cleaving system 1100 can include actuator 1102, cleave-tip platform 1104, cleaving base 1106, and beams 1108 and 1109, one or more of which can be configured to be centered along a centerline 1110.

Figure 12:
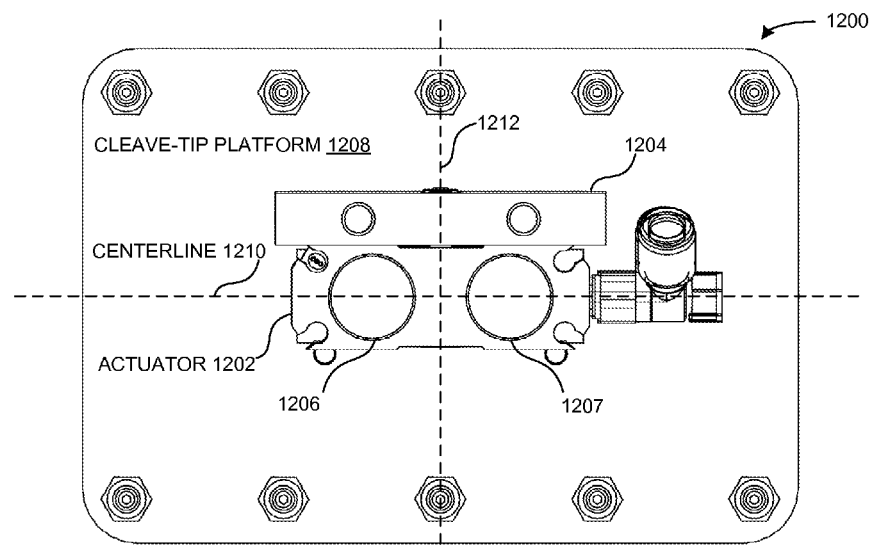
FIG. 12 shows a top view of a cleaving head according to one embodiment of the invention.

FIG. 12 shows a top view of cleaving head 1200, according to one embodiment of the invention. Cleaving head 1200 can include actuator 1202 coupled to cleaving-head mount 1204. Actuator 1202 can include a set of pistons 1206 and 1207 mechanically coupled to a cleave-tip platform 1208. Pistons 1206 and 1207 can be centered along horizontal centerline 1210 of cleave-tip platform 1208, and can be equidistant from a vertical centerline 1212 of cleave-tip platform 1208.

Figure 13:
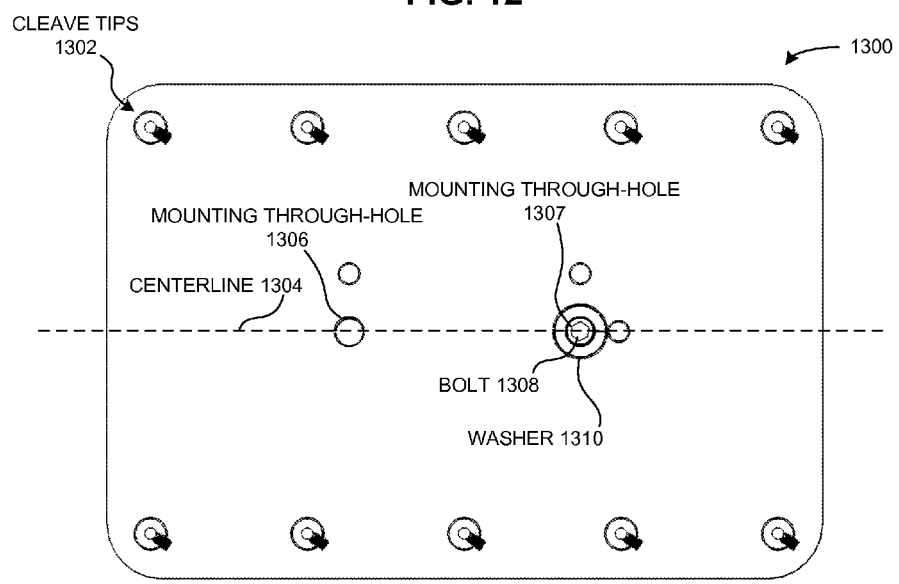
FIG. 13 shows a bottom view of a cleave-tip platform according to one embodiment of the invention.

FIG. 13 shows a bottom view of a cleave-tip platform 1300, according to one embodiment of the invention. Cleave-tip platform 1300 can include a plurality of cleave tips 1302 that may be mounted on the bottom surface of cleave-tip platform 1300, and may be arranged in two rows equidistant from a horizontal centerline 1304 of cleave-tip platform 1300. Cleave-tip platform 1300 can also include a set of bolt through-holes 1306 and 1307 for coupling cleave-tip platform 1300 to a set of actuator pistons (not shown). For example, a bolt 1308 can be inserted into a washer 1310 and bolt through-hole 1307, and can be screwed into a piston on a top surface of cleave-tip platform 1300 to couple cleave-tip platform 1300 to the piston.

Figure 14:
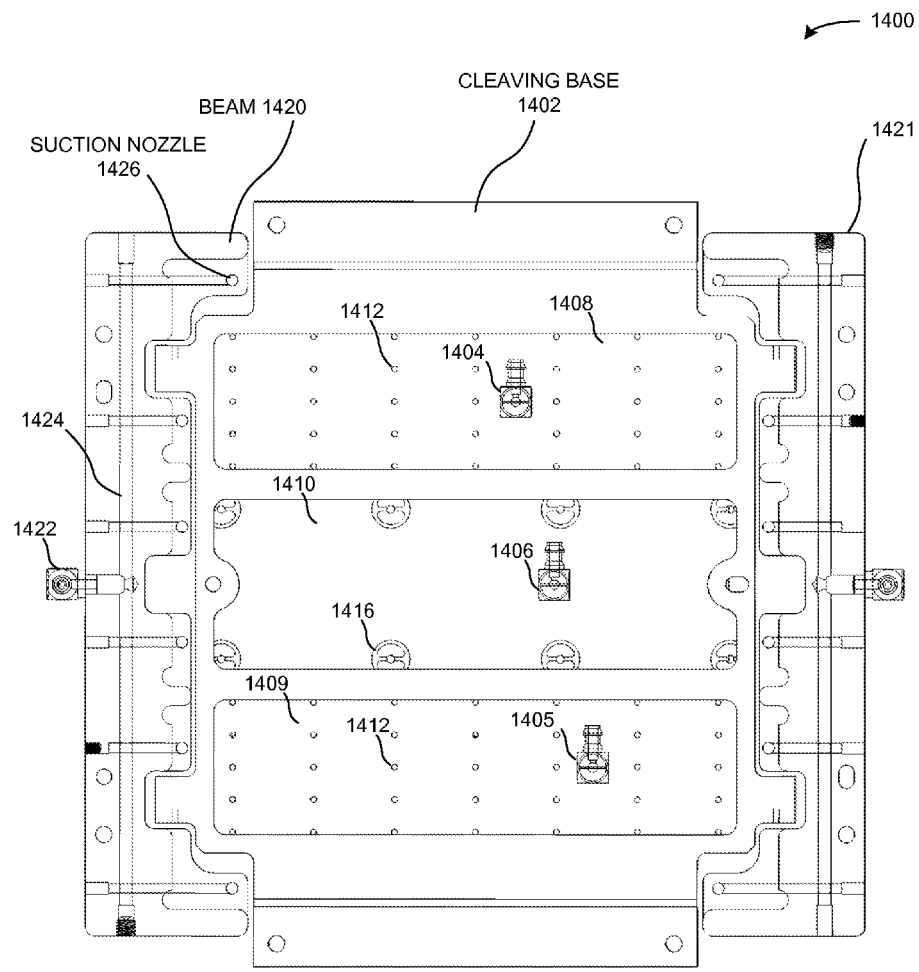
FIG. 14 shows a bottom view of a cleaving base and a walking beam according to one embodiment of the invention.

FIG. 14 shows a bottom view of cleaving base 1400 and walking beam 1450, according to one embodiment of the invention. Recall that a top surface of cleaving base 1400 can include suction nozzles 1416 that can create a suction force to safely hold down the center strip of a photovoltaic structure on center plane 1410, and can include a set of air jets 1412 on sides slopes 1408 and 1409 that can soften the landing of the side strips after the cleaving process. The bottom surface of cleaving base 1400 can include plugs 1404 and 1405 to provide a positive airflow to air jets 1412, and can also include a plug 1406 for providing a negative airflow to suction nozzles 1416. A set of channels inside cleaving base 1400 can direct airflow from plugs 1404 and 1405 toward air jets 1412, and a set of channels that can direct airflow between suction nozzles 1416 and plug 1406.

Beams 1420 and 1421 can also include a retention system that can hold down a photovoltaic structure while beams 1420 and 1421 move the photovoltaic structure across the cleaving table. For example, beam 1420 can include a set of suction nozzles (e.g., suction nozzle 1426) that can create a suction force to hold down the photovoltaic structure, and can include plug 1422 coupled to an air channel 1424 that reaches the suction nozzles. When a beam-shifting apparatus moves beams 1420 and 1421 to or from the cleaving system, a vacuum pump coupled to plug 1422 can produce a suction force at or near the suction nozzles to prevent the photovoltaic structure from shifting or falling out of beams 1420 and 1421.

Beams 1420 and 1421 can have an inner ridgeline, which can contour an outer ridgeline of cleaving base 1402. When the beam-shifting apparatus lowers beams 1420 and 1421 onto cleaving base 1402, the tight contour between cleaving base 1402 and beams 1420 and 1421 can facilitate moving the photovoltaic structure onto cleaving base 1402. At this point, the vacuum pump for cleaving base 1402 can be activated to down the photovoltaic structure on cleaving base 1402, and the vacuum pump for beams 1420 and 1421 can be deactivated to release the photovoltaic structure from beams 1420 and 1421.

Examples described above are based on a three-segment photovoltaic structure configuration. Embodiments of the invention can be used to produce any number of strips from a single photovoltaic structure. In addition, embodiments of the invention are not limited to a downward cleaving system. In some embodiments, it may be possible to cleave the photovoltaic structure with an upward movement of the cleaving contact portion (such as cleave tips), which the center region of the photovoltaic structure is retained at a fixed position. It is also possible to hold the photovoltaic structure in a vertical position, where the cleave tips are actuated to move sideways.

Figure 15:
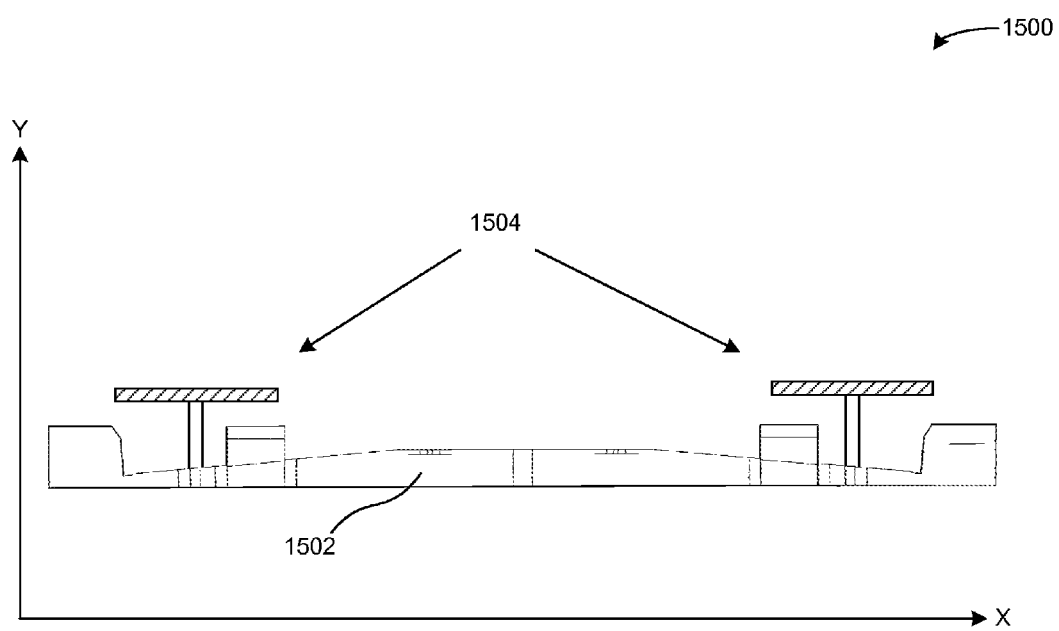
FIG. 15 shows a lifting apparatus of a cleaving base according to another embodiment of the invention.

FIG. 15 shows a lifting apparatus of cleaving base 1500, according to another embodiment of the invention. In this embodiment, cleaving base 1500 can have two lift apparatuses 1504 housed inside cleaving system 1500. Lift apparatuses 1504 may reside flush with, or below the side surfaces of cleaving base 1502 when lift apparatuses 1504 are retracted. An actuator (not shown) can raise lift apparatuses 1504 above the side surfaces of base 1502, for example, to separate the side strips from the center strip of the photovoltaic structure, and/or to rotate the side strips along a Y-axis. Lift apparatuses 1504 may have a suction force on their top surface (not shown) that can hold the strip that was cleaved while lifting the strip and rotating it along the Y-axis. After rotation, lift apparatuses 1504 can retract and the strip can be put back on the surface of base 1502.

Figure 16A:
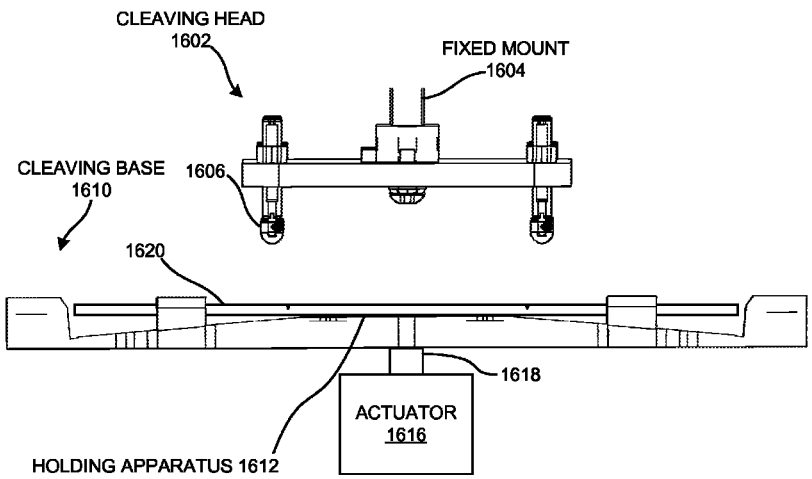
FIG. 16A shows an actuator coupled to a cleaving base according to one embodiment of the invention.

FIG. 16A shows actuator 1616 coupled to a cleaving base 1610, according to one embodiment of the invention. Photovoltaic structure 1620 can be placed on a cell-holding apparatus 1612 of cleaving base 1610 while cleaving base 1610 may be in a standby position (e.g., at a lowest height). Cell-holding apparatus 1612 can then initiate a suction hold on a center region of photovoltaic structure 1620 to secure photovoltaic structure 1620. Actuator 1616 can then be activated to extend shaft 1618, which in turn may raise cleaving base 1610 toward a cleaving head 1602 mounted on fixed mount 1604 to cleave photovoltaic structure 1620.

Figure 16B:
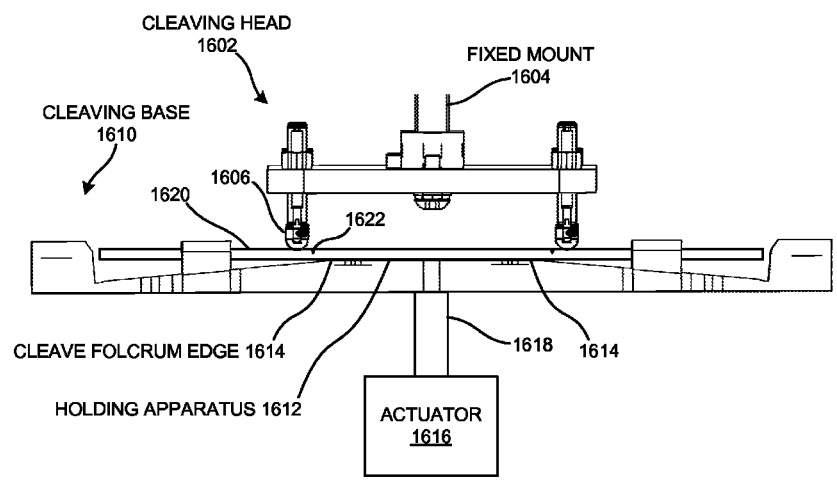
FIG. 16B shows a raised cleaving base according to one embodiment of the invention.

FIG. 16B shows a raised cleaving base 1610, according to one embodiment of the invention. Actuator 1616 can extend shaft 1618 until photovoltaic structure 1620 makes contact with cleave tips 1606 of cleaving head 1602. The upward force on cleaving base 1610 by actuator 1616 can cause an upward force on a center region of photovoltaic structure 1620 between cleave fulcrum edges 1614 of cell-holding apparatus 1612. Also, when cleave tips 1606 make contact with the top surface of the two side regions of photovoltaic structure 1620, the upward pressure on the center region and the downward pressure on the two side regions can cause photovoltaic structure 1620 to become cleaved, along scribed grooves 1622, into multiple strips.

Figure 17A:
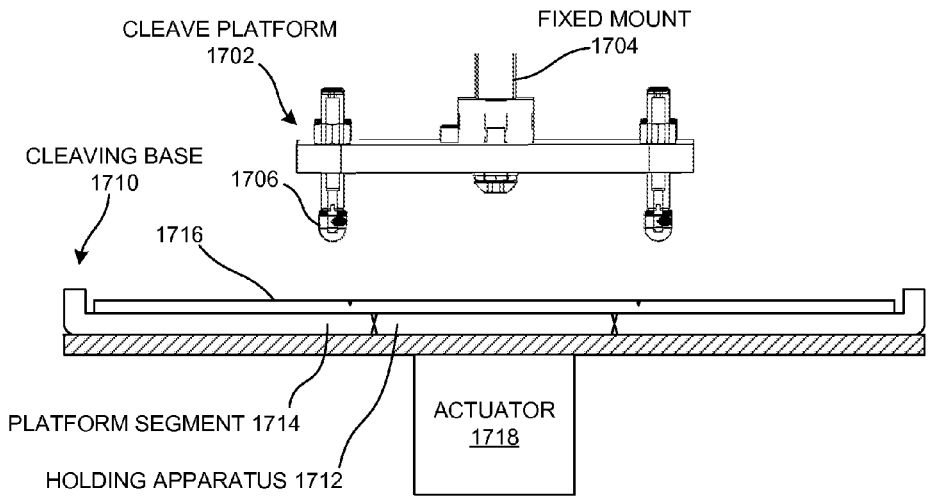
FIG. 17A shows an actuator coupled to a cell-holding apparatus of cleaving base according to one embodiment of the invention.

FIG. 17A shows actuator 1718 coupled to cell-holding apparatus 1712 of cleaving base 1710, according to one embodiment of the invention. Cleaving base 1710 can include two platform segments 1714, which may be coupled to each side of cell-holding apparatus, such as by a hinge or a flexible joint. Cleaving base 1710 may be initially flat, at which point photovoltaic structure 1716 may be placed on a top surface of cleaving base 1710. Actuator 1718 can then raise cell-holding apparatus 1712 toward cleave tips 1706 of cleave platform 1702. Raising cell-holding apparatus 1712 can create a fulcrum edge that separates photovoltaic structure 1716 into multiple strips.

In some embodiments, cleave platform 1702 may be mounted on a fixed mount 1704, and may not be coupled to an actuator. Hence, the cleaving process may be performed by raising cleaving system 1712, and not by lowering cleave platform 1702.

Figure 17B:
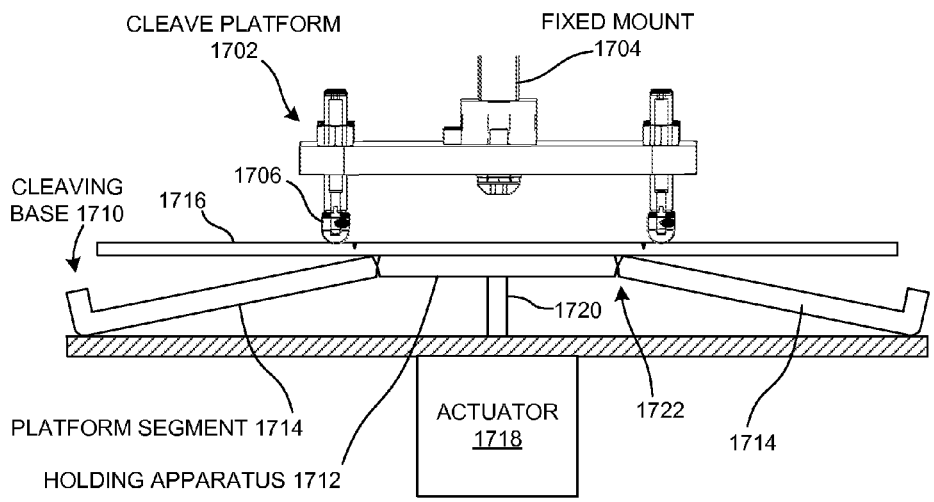
FIG. 17B shows fulcrum edges created by raising cell-holding apparatus of cleaving base according to one embodiment of the invention.

FIG. 17B shows fulcrum edges 1722 created by raising cell-holding apparatus 1712 of cleaving base 1710, according to one embodiment of the invention. For example, actuator 1718 can extend shaft 1720, which can lift cell-holding apparatus 1712 to a predetermined height. Because platform segments 1714 may be coupled to each side of cell-holding apparatus 1712 by a hinge or flexible joint, one side of platform segments 1714 can raise along with cell-holding apparatus 1712 while an opposing side can remain at a lower elevation. This can raise photovoltaic structure 1716 toward cleave tips 1706 and create fulcrum edges 1722 at the two sides of cell-holding apparatus 1712.

Once a top surface of photovoltaic structure 1716 makes contact with cleave tips 1706, the upward force on the center region of photovoltaic structure 1716 from cell-holding apparatus 1712 can cause the side regions of photovoltaic structure 1716 to make contact with and press against cleave tips 1706. This contact can cause photovoltaic structure 1716 to separate, along the scribed grooves near fulcrum edges 1722, into multiple strips.

In some variations of the cleaving system, the cleaving base may include a cell-holding apparatus that holds the two side regions of a photovoltaic structure, while a center strip is cleaved from the two side regions.

Figure 18A:
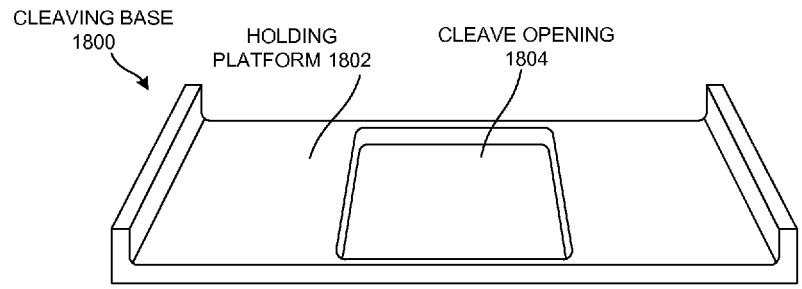
FIG. 18A shows a cleaving base with a cleave opening according to one embodiment of the invention.

FIG. 18A shows a cleaving base 1800 with cleave opening 1804, according to one embodiment of the invention. Cleaving base 1800 may have a flat surface, and can include cleave opening 1804 at a center of cleaving base 1800. The remaining flat portion of cleaving base 1800 may operate as cell-holding platform 1802 that can retain a photovoltaic structure. In some embodiments, cell-holding platform 1802 can include one or more suction nozzles that make a suction hold on the bottom surface of the photovoltaic structure.

Figure 18B:
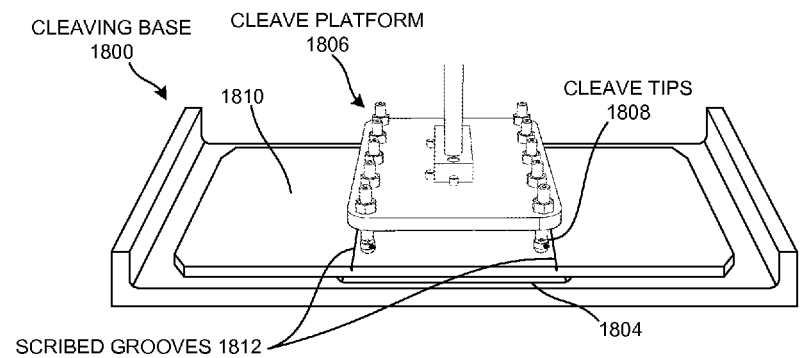
FIG. 18B shows a cleaving action on a cleaving base according to one embodiment of the invention.

FIG. 18B shows a cleaving action on cleaving base 1800, according to one embodiment of the invention. Photovoltaic structure 1810 can be placed on cleaving base 1800, so that a center region of photovoltaic structure 1810 (e.g., a region between two scribed grooves 1812) rests over cleave opening 1804. The width of cleave opening 1804 can be greater than the distance between scribed grooves 1812 of photovoltaic structure 1810. An actuator (not shown) can lower cleave platform 1806 that includes a set of cleave tips 1808 toward the center region of photovoltaic structure 1810. The downward force on the center region of photovoltaic structure 1810 can cause the center region to separate from photovoltaic structure 1810 along scribed grooves 1812.

Figure 18C:
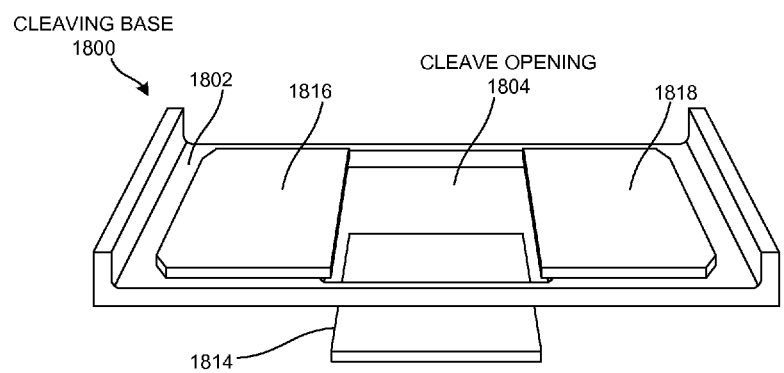
FIG. 18C shows a cleaved photovoltaic structure according to one embodiment of the invention.

FIG. 18C shows a cleaved photovoltaic structure, according to one embodiment of the invention. Center strip 1814 of the photovoltaic structure can fall through cleave opening 1804 of cleaving base 1800, and side strips 1816 and 1818 of photovoltaic structure 1810 can remain on cell-holding platform 1802 of cleaving base 1800. In some embodiments, center strip 1814 can fall onto a cell-holding apparatus, a conveyor, or any apparatus that can hold or can move center strip 1814 toward another processing station.

To summarize, embodiments of the invention provide a photovoltaic structure cleaving system that can cleave a photovoltaic structure into two or more strips with precision, with high throughput, and with little damage to the photovoltaic structure. The system can be configured to operate automatically, which can allow the system to be used for high-volume production. This cleaving system can be used as part of an assembly line for automated manufacturing of solar panels, or can be used as a stand-alone system. Moreover, various actuation methods and systems can be used for any moving part in this cleaving system, including but not limited to: a servo-motor based actuation system, a hydraulic system, a pneumatic system or any combination thereof.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. An apparatus for separating a photovoltaic structure, the apparatus comprising:
   a first surface; and
   a second surface connected to the first surface;
      wherein the second surface is not parallel to the first surface;
      wherein the first surface comprises a holding mechanism adapted to hold the photovoltaic structure;
      wherein a junction between the first surface and second surface forms a first fulcrum edge, thereby facilitating the photovoltaic structure to be held on the first surface and separated along the first fulcrum edge;
      wherein the second surface is configured to direct air towards a separated portion of the photovoltaic structure after separation; and
      wherein the second surface comprises a buffer mechanism adapted to reduce impact when the photovoltaic structure lands on the second surface.

2. The apparatus of claim 1, wherein the buffer mechanism comprises at least one device adapted to slow down the photovoltaic structure's movement after being separated by creating an air flow.

3. An apparatus for separating a photovoltaic structure, the apparatus comprising:
   a first surface;
   a second surface connected to the first surface; and
   an edge connected to the second surface and adapted to guide a strip of the photovoltaic structure after being separated to fall into a predetermined position;
      wherein the second surface is not parallel to the first surface;
      wherein the first surface comprises a holding mechanism adapted to hold the photovoltaic structure;
      wherein a junction between the first surface and second surface forms a first fulcrum edge, thereby facilitating the photovoltaic structure to be held on the first surface and separated along the first fulcrum edge; and
      wherein the second surface is configured to direct air towards a separated portion of the photovoltaic structure after separation.

4. An apparatus for separating a photovoltaic structure, the apparatus comprising:
   a first surface;
   a second surface connected to the first surface; and
   a third surface connected to and forming a non-180-degree angle with the first surface, wherein a junction between the first surface and third surface forms a second fulcrum edge, thereby facilitating the photovoltaic structure to be separated into three strips;
      wherein the second surface is not parallel to the first surface;
      wherein the first surface comprises a holding mechanism adapted to hold the photovoltaic structure;
      wherein a junction between the first surface and second surface forms a first fulcrum edge, thereby facilitating the photovoltaic structure to be held on the first surface and separated along the first fulcrum edge; and
      wherein the second surface is configured to direct air towards a separated portion of the photovoltaic structure after separation.

5. A cleaving system comprising:
   a holding apparatus adapted to retain a photovoltaic structure at a center section of a cleaving platform;
   a contact apparatus adapted to make contact with the photovoltaic structure and separate the photovoltaic structure into a plurality of strips; and
   an actuator adapted to move the contact apparatus against the photovoltaic structure, thereby separating the photovoltaic structure into strips,
   wherein the holding apparatus comprises side sections sloped from the center section, the side sections comprising air jets to direct air towards the strips after separation from the center section.

6. The cleaving system of claim 5, wherein the contact apparatus comprises a plurality of contact tips, at least two of which are arranged at different distances from a base of the contact apparatus.

7. The cleaving system of claim 5, wherein the holding apparatus comprises at least one air-suction mechanism adapted to maintain a suction hold on the photovoltaic structure.

8. The cleaving system of claim 5, wherein upon being actuated the contact mechanism is operable to separate the photovoltaic structure into three strips.

9. A method comprising:
   activating a holding apparatus to retain a photovoltaic structure at a center section of a cleaving platform; and
   activating an actuator to cause a contact apparatus to contact the photovoltaic structure and separate the photovoltaic structure into three portions, comprising a first portion, and second portion, and a third portion, along two fulcrum edges on the cleaving platform,
   wherein the first portion and the second portion are simultaneously cleaved from the photovoltaic structure by the contact apparatus, the first portion and second portion extending from opposite sides of the third portion of the photovoltaic structure, wherein the first portion and second portion extend in cantilever from the holding apparatus before the contact apparatus makes contact with the first portion and second portion.

10. The method of claim 9, wherein activating the actuator comprises lowering the contact apparatus to make contact with the photovoltaic structure.

11. The method of claim 9, wherein activating the actuator comprises raising the holding apparatus to cause a top surface of the photovoltaic structure to make contact with the contact apparatus.

12. The method of claim 9, wherein the contact apparatus comprises a plurality of cleave tips, at least two of which are arranged at different distances from a base of the contact apparatus; and wherein activating the actuator comprises causing the cleave tips to contact the photovoltaic structure sequentially.

13. The method of claim 9, wherein a side section of the cleaving platform is sloped from the center section;

wherein the side section of the cleaving platform comprises a plurality of air-emitting jets; and wherein the method further comprises ejecting air via the jets at the first and second portions after the contact apparatus makes contact with the first portion and second portion.

* * * * *